(12) United States Patent
Brower et al.

(10) Patent No.: US 12,058,827 B2
(45) Date of Patent: Aug. 6, 2024

(54) ELECTRICAL WIRING DEVICE WITH FACEPLATE MODULE

(71) Applicant: Hubbell Incorporated, Shelton, CT (US)

(72) Inventors: John Edward Brower, Fairfield, CT (US); Emircan Matthew Dumani, Shelton, CT (US); James Casey Musson, Derby, CT (US)

(73) Assignee: HUBBELL INCORPORATED, Shelton, CT (US)

( * ) Notice: Subject to any disclaimer, the term of this patent is extended or adjusted under 35 U.S.C. 154(b) by 0 days.

(21) Appl. No.: 17/407,583

(22) Filed: Aug. 20, 2021

(65) Prior Publication Data

US 2022/0061178 A1 Feb. 24, 2022

Related U.S. Application Data

(60) Provisional application No. 63/068,732, filed on Aug. 21, 2020.

(51) Int. Cl.
*H05K 5/03* (2006.01)
*H03K 17/96* (2006.01)
*H05K 5/02* (2006.01)

(52) U.S. Cl.
CPC ............. *H05K 5/03* (2013.01); *H03K 17/962* (2013.01); *H05K 5/0252* (2013.01)

(58) Field of Classification Search
CPC ...... H05K 5/03; H05K 5/0252; H03K 17/962; H03K 2217/960755
See application file for complete search history.

(56) References Cited

U.S. PATENT DOCUMENTS

| | | | |
|---|---|---|---|
| 5,898,130 A | 4/1999 | Tansi | |
| 6,050,849 A | 4/2000 | Chang | |
| 6,366,671 B1 | 4/2002 | Beavers | |
| 7,531,921 B2 * | 5/2009 | Cencur | H03K 17/955 307/126 |
| 8,542,819 B2 | 9/2013 | Hazani | |
| 8,658,893 B1 | 2/2014 | Shotey | |
| 8,882,536 B2 | 11/2014 | Utz | |
| 9,198,259 B2 | 11/2015 | Hoang | |

(Continued)

FOREIGN PATENT DOCUMENTS

| | | |
|---|---|---|
| WO | 20020087041 | 10/2002 |
| WO | 20170155998 | 9/2017 |

OTHER PUBLICATIONS

International Search Report and Written Opinion mailed in corresponding PCT/US21/46863 on Nov. 26, 2021 (7 pages).

(Continued)

*Primary Examiner* — Anthony M Haughton
*Assistant Examiner* — Theron S Milliser
(74) *Attorney, Agent, or Firm* — Wissing Miller LLP

(57) ABSTRACT

A faceplate assembly and a wiring device having the faceplate assembly are provided. The faceplate assembly includes a wall plate, a wiring device interface and at least one sensor. The wiring device interface has a set of electrical contacts positioned on a rear surface of the wiring device interface configured to mate with a set of contacts on the wiring device. The at least one sensor and at least a portion of the wiring device interface are embedded in the wall plate.

19 Claims, 20 Drawing Sheets

(56) References Cited

U.S. PATENT DOCUMENTS

| | | | |
|---|---|---|---|
| 9,685,783 B2 | 6/2017 | Raneri | |
| 9,965,007 B2 | 5/2018 | Amelio | |
| 10,222,768 B2 | 3/2019 | Lancaster | |
| 10,432,195 B2* | 10/2019 | Lucantonio | H01R 13/70 |
| 10,594,101 B2 | 3/2020 | Brower | |
| 2008/0001649 A1* | 1/2008 | Cencur | H03K 17/955 |
| | | | 307/125 |
| 2008/0235943 A1 | 10/2008 | Gorman | |
| 2013/0335020 A1 | 12/2013 | Moore | |
| 2014/0093057 A1 | 4/2014 | Hazani | |
| 2014/0368977 A1 | 12/2014 | Lenny | |
| 2015/0244121 A1 | 8/2015 | Amelio | |
| 2015/0256665 A1 | 9/2015 | Pera | |
| 2016/0126950 A1* | 5/2016 | Lucantonio | H01R 24/30 |
| | | | 307/113 |
| 2016/0191268 A1 | 6/2016 | Diebel | |
| 2017/0273203 A1 | 9/2017 | Iaconis | |
| 2019/0049585 A1 | 2/2019 | Gnan | |
| 2019/0221958 A1 | 7/2019 | Karc | |
| 2019/0296506 A1 | 9/2019 | McQueen | |

OTHER PUBLICATIONS

International Preliminary Report on Patentability mailed in corresponding PCT/US21/46863 on Mar. 2, 2023 (6 pages).

* cited by examiner

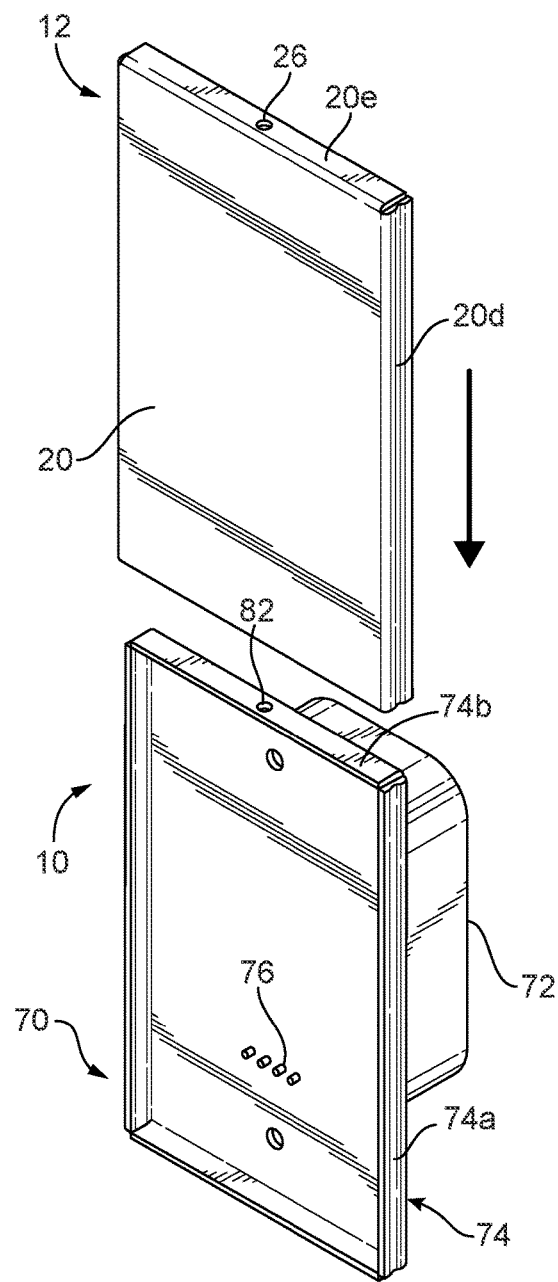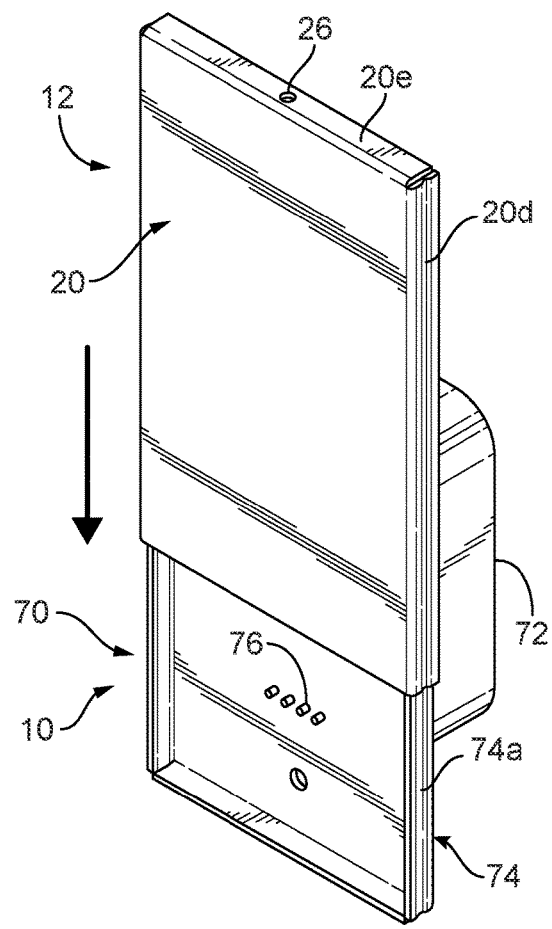
FIG. 16
FIG. 17

ELECTRICAL WIRING DEVICE WITH FACEPLATE MODULE

CROSS REFERENCE TO RELATED APPLICATIONS

The present application is based on and claims benefit from U.S. Provisional Patent Application Ser. No. 63/068,732 filed on Aug. 21, 2020, entitled "Electrical Wiring Device with Faceplate Module" the contents of which are incorporated herein in their entirety by reference.

BACKGROUND

Field

The present disclosure relates generally to modular electrical wiring device assemblies, and more particularly to modular electrical wiring device assemblies that include a faceplate module and an electrical wiring device module with a sensor embedded in the faceplate module or the electrical wiring device module.

Description of the Related Art

Electrical devices, specifically electrical receptacles capable of receiving electrical plugs, generally include two or three sets of blade apertures, with each set arranged to receive an electrical plug. The electrical receptacle or device is sold as a single unit or a multi-pack in home improvement stores and is then wired in by either a professional electrician or by the homeowner if he or she is comfortable with electrical wiring. For the average homeowner, replacing the electrical device can be expensive due to hiring an electrician or dangerous should they attempt the replacement themselves. Different outlet types are increasingly being used in homes, including USB outlets.

SUMMARY

The present disclosure provides exemplary embodiments of modular electrical wiring device assemblies. Generally, the modular electrical wiring device assemblies include a faceplate module and an electrical wiring device module with one or more sensors embedded in the faceplate module or the electrical wiring device module. In an exemplary embodiment, the faceplate module includes a wall plate, a wiring device interface and at least one sensor. The wiring device interface has a set of electrical contacts positioned on a rear surface of the wiring device interface. The set of electrical contacts are capable of mating with a corresponding set of contacts on the electrical wiring device module. The at least one sensor and at least a portion of the wiring device interface are embedded in the wall plate. The electrical wiring device module includes an electrical wiring device and may include a mounting plate.

In another exemplary embodiment, the faceplate module includes a wall plate, a wiring device interface and at least one sensor. The wiring device interface has one or more electrical contacts positioned on a rear surface thereof. The one or more electrical contacts are capable of mating with one or more corresponding electrical contacts on the electrical wiring device module. The at least one sensor and at least a portion of the wiring device interface are embedded in the wall plate.

In another exemplary embodiment, the faceplate module includes a wall plate, a wiring device interface and at least one sensor. The wall plate has an inner surface and a substantially smooth outer surface. The wiring device interface has one or more electrical contacts positioned away from the inner surface of the wall plate. The at least one sensor is physically and electrically connected to the wiring device interface such that the at least one sensor and at least a portion of the wiring device interface are positioned relative to the inner surface of the wall plate so that the at least one sensor is adjacent the inner surface of the wall plate.

An exemplary embodiment of a wiring device assembly includes a wiring device module and a wall plate. The wiring device module has an electrical wiring device, a mounting plate configured to be mounted to an electrical box and at least one sensor. The electrical wiring device is attached to a first surface of the mounting plate, and the at least one sensor is attached to a second surface of the mounting plate and in electrical communication with the electrical wiring device. The wall plate is releasably attachable to the mounting plate. The mounting plate may include at least one flexible arm that fits into at least one opening in the wall plate to releasably attach the wall plate and the mounting plate. In one embodiment, the wall plate may include a pair of side walls each having a curved surface, and the mounting plate may include a pair of side walls each having a curved surface. The curved surfaces on the side walls of the wall plate are configured to be received in the curved surfaces on the side walls of the mounting plate. In another embodiment, the wall plate may include a pair of end walls each having a curved surface, and the mounting plate may include a pair of end walls each having a curved surface. The curved surfaces on the end walls of the wall plate are configured to be received in the curved surfaces on the end walls of the mounting plate. Preferably, the wall plate has a substantially smooth outer surface. The at least one sensor may be a capacitive type sensor or a time of flight sensor.

Another exemplary embodiment of a wiring device assembly includes a wiring device module and a faceplate module. The wiring device module has an electrical wiring device and a mounting plate configured to be mounted to an electrical box. The electrical wiring device is attached to a first surface of the mounting plate and electrically connected to at least one electrical contact extending from a second surface of the mounting plate. The faceplate module includes a wall plate, a wiring device interface and at least one sensor. The wall plate has an inner surface and a substantially smooth outer surface. The wiring device interface has at least one electrical contact positioned away from the inner surface of the wall plate and configured to electrically connect to the at least one electrical contact extending from a second surface of the mounting plate. The at least one sensor is physically and electrically connected to the wiring device interface such that the at least one sensor and at least a portion of the wiring device interface are positioned relative to the inner surface of the wall plate so that the at least one sensor is adjacent the inner surface of the wall plate.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein:

FIG. 16 is a front perspective view of the wiring device assembly of FIG. 12, illustrating the faceplate module separated from the electrical wiring device module and positioned for vertical mounting to a mounting plate of the electrical wiring device module;

FIG. 17 is a front perspective view of the wiring device assembly of FIG. 16, illustrating a wall plate of the faceplate module being mounted to the mounting plate of the electrical wiring device module;

DETAILED DESCRIPTION

The present disclosure provides exemplary embodiments of modular electrical wiring device assemblies that include a faceplate module, an electrical wiring device module, and one or more control devices. For ease of description, the modular electrical wiring device assemblies may also be referred to herein as the "device assemblies" in the plural and the "device assembly" in the singular. The faceplate module is an assembly of components that may include a wiring device module interface and for ease of description the "wiring device module interface" may also be referred to herein as the "interfaces" in the plural and the "interface" in the singular. The faceplate module preferably includes a wall plate that has a smooth exterior surface that permits direct wipe down and cleaning with few places, if any, for dirt and/or debris to catch and/or collect. The electrical wiring device module is an assembly of components that include an electrical wiring device. For ease of description, the electrical wiring device module may also be referred to herein as the "device modules" in the plural and the "device module" in the singular. The electrical wiring devices included in the device modules contemplated by the present disclosure include, but are not limited to, electrical switches and electrical receptacles. Non-limiting examples of electrical switches include single pole switches, 3-way switches, 4-way switches, dimmer switches and solid-state electronic switches and relays. For ease of description, the electrical switches may also be referred to herein as the "switches" in the plural and the "switch" in the singular, and the electrical receptacles may also be referred to herein as the "receptacles" in the plural and the "receptacle" in the singular. The one or more control devices may be, for example, sensors, described in more detail below, may be embedded in the faceplate module or the device module of the device assembly. The one or more control devices are provided to permit the activation or deactivation of the electrical wiring device of the device module.

Figure 1:
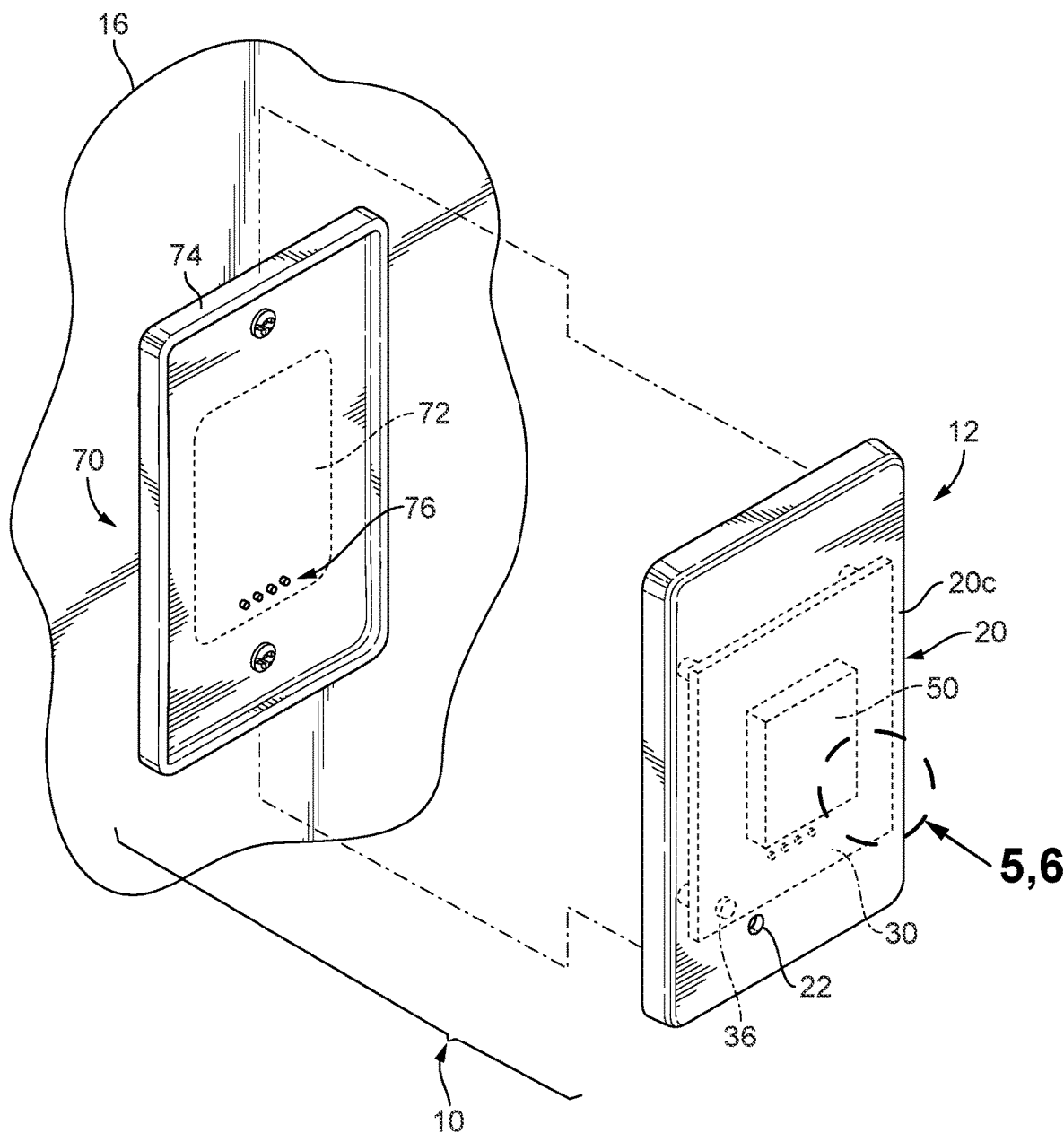
FIG. 1 is a front partially exploded perspective view of an exemplary embodiment of a wiring device assembly according to the present disclosure, illustrating an electrical wiring device module mounted to an electrical box and covered by sheetrock and a faceplate module with an embedded sensor and wiring device interface.
Figure 2:
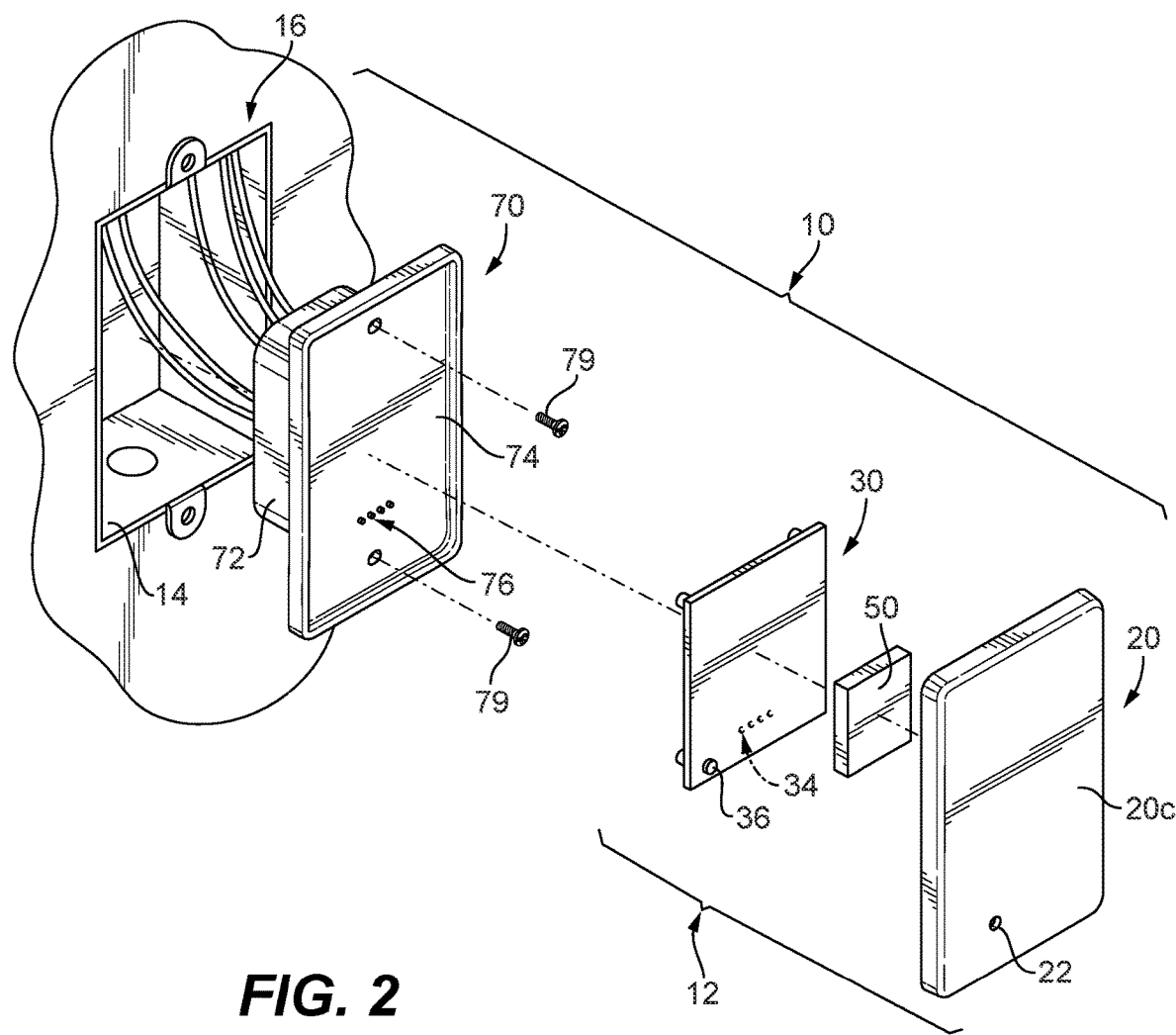
FIG. 2 is a front partially exploded perspective view of the wiring device assembly of FIG. 1, illustrating the wiring device module and the faceplate module with an embedded sensor and wiring device interface.
Figure 3:
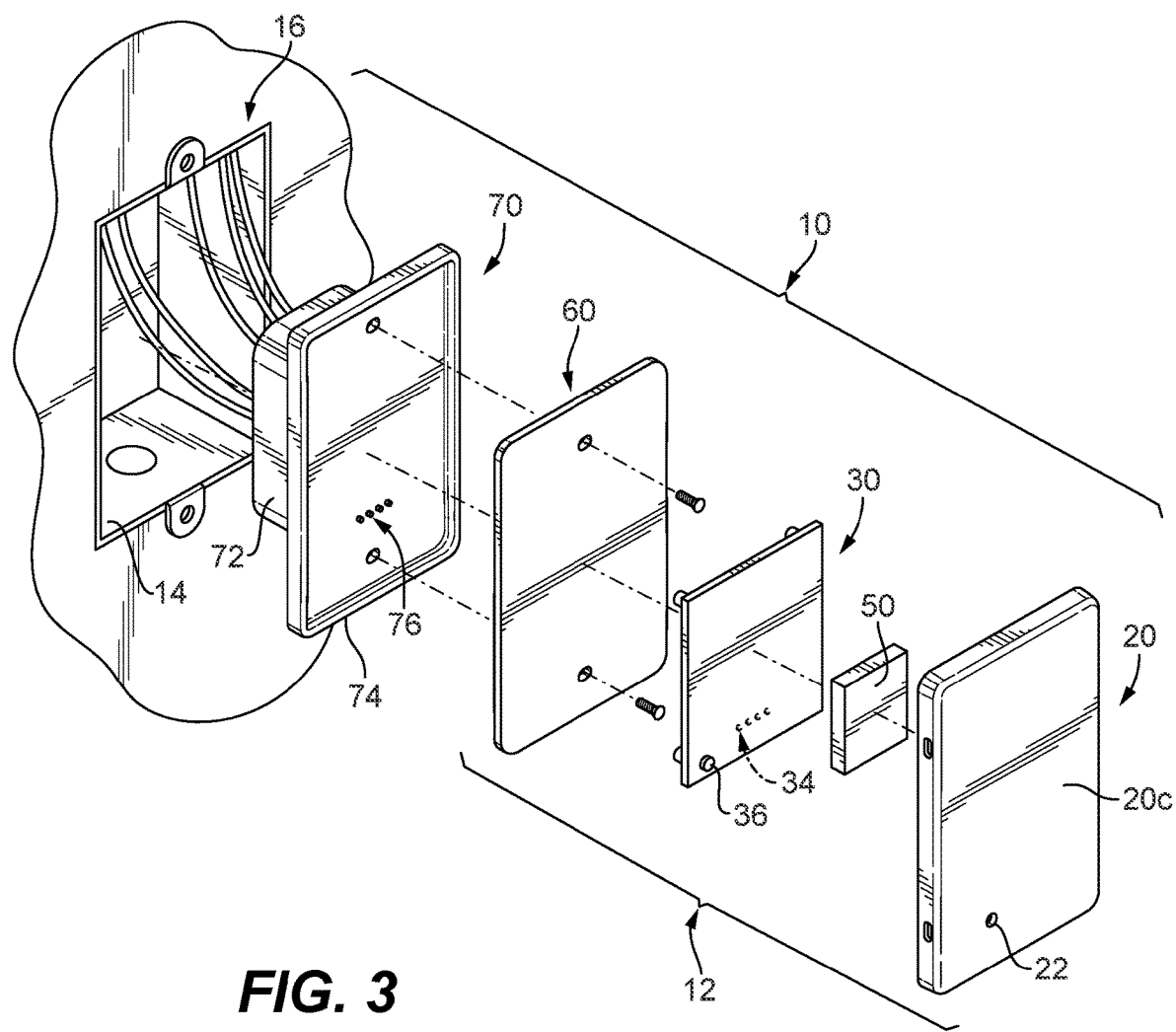
FIG. 3 is a front partially exploded perspective view of another exemplary embodiment of the wiring device assembly according to the present disclosure, illustrating the wiring device module, and the faceplate module with an embedded sensor and wiring device interface, and a subplate positioned between the wiring device module and the wiring device interface.

Referring now to FIGS. 1-3, an exemplary embodiment of a device assembly 10 according to the present disclosure is shown. In this exemplary embodiment, the device assembly 10 includes a faceplate module 12 and a device module 70. In the embodiment of FIG. 1, the device assembly 10 is configured to be mounted to an electrical box 14 mounted within a wall 16. In the embodiment of FIGS. 1 and 2, the faceplate module 12 may include a wall plate 20, a wiring device interface 30 and one or more sensors 50. In the embodiment of FIGS. 1 and 3, the faceplate module 12 may include the wall plate 20, the wiring device interface 30, the one or more sensors 50 and an optional subplate 60. The optional subplate 60 may be positioned between the device module 70 and the wall plate 20 of the faceplate module 12.

The wall plate 20, also known as a faceplate, may be made of a material that does not conduct electricity, i.e., a non-conductive material or the wall plate 20 may be made of a metallic material. Non-limiting examples of the non-conductive material include Polycarbonate Thermoplastic and Thermoplastic Nylon. Non-limiting examples of the metallic materials include stainless steel, nickel, brass and bronze, The wall plate 20 may include an interior portion and an exterior portion. The interior portion of the wall plate 20 may include a cavity 20a, seen in FIG. 4, configured and dimensioned to at least receive the wiring device interface 30 so that the one or more sensors 50 are positioned adjacent an interior surface of the interior portion of the wall plate 20.

Preferably, the exterior portion of the wall plate 20, seen in FIG. 2, includes a smooth exterior surface 20c that permits direct wipe down and cleaning with few places, if any, for dirt and/or debris to catch and/or collect. The wall plate 20 of the faceplate module 12 may include a display similar to that shown and described in commonly owned U.S. Pat. No. 10,594,101 which is incorporated herein in its entirety by reference. Generally, the display can be any type of screen (e.g., an LCD, LED, OLED display) that is visible from the exterior surface 20c of the exterior portion of the wall plate 20. Information from the one or more sensors 50 and/or the wiring module 70 may be provided to the display, such as for example weather, time, functioning status, charging status and load status. The display can be a touch sensitive display that allows a user to access different options or settings and to control one or more electrical loads via the wiring module 70 in a given area, such as a room or a house.

Continuing to refer to FIGS. 1-4, the wall plate 20 may include one or more apertures 22 though which light from one or more indicators 36 may be visible from the exterior surface 20c of the wall plate 20. The one or more indicators 36, described in more detail below, may be included on the wiring device interface 30 and can be provided to indicate a status of, for example, the sensor 50 and/or the wiring device module 70. In another exemplary embodiment, the one or more indicators 36 may be included in the wiring device module 70 and can be provided to indicate a status of, for example, the wiring device module 70. In the event the wall plate 20 includes a display, the one or more apertures 22 may be positioned separately from the display, or the one or more apertures 22 and the one or more indicators 36 may be replaced with information presented on the display. In another exemplary embodiment, the one or more indicators 36 may be attached directly to the wall plate 20 and operatively connected to the wiring device interface 30 or the electrical wiring device 72 of the wiring device module 70.

Referring to FIG. 3, in the event an optional subplate 60 is included in the device assembly 10, the wall plate 20 may be configured to mate with the subplate 60 via a friction fit or snap fit connection, or the wall plate 20 may also include an upper mounting aperture and a lower mounting aperture for receiving a fastener, such as a screw, to secure the wall plate 20 to the subplate 60 and/or the mounting plate 74 of the wiring device module 70 and/or the electrical box in which the wiring device module 70 is installed within. The subplate 60 may be made of a material that is electrically conductive or a non-conductive material. Non-limiting examples of non-conductive materials are described above. Non-limiting examples of conductive materials include metallic materials such as stainless steel, nickel, brass and bronze. In the exemplary embodiment of FIGS. 1 and 3, the optional subplate 60 is provided to provide structural support to the wiring device module 70 when installed within the electrical box 14, and in some instances to increase the sensitivity of the one or more sensors 50. For example, if the subplate 60 is made of an electrically conductive material, e.g., a metallic material, and the one or more sensors 50 are capacitive type sensors, the electrically conductive subplate 60 can improve the sensitivity of the capacitive type sensors 50.

The faceplate module 12 contemplated by the present disclosure may be a single gang faceplate module that includes a single gang wall plate 20, or the faceplate module 12 contemplated by the present disclosure may be a multi-gang faceplate module that includes a multi-gang wall plate 20. In instances where the faceplate module 12 is a multi-gang faceplate module, each gang of the multi-gang wall plate 20 may include one or more of the features described herein, such as a wiring device interface 30 and one or more sensors 50. In another embodiment, in instances where the faceplate module 12 is a multi-gang faceplate module, one or more of the gangs of the multi-gang wall plate 20 may include one or more of the features described herein, such as a wiring device interface 30 and one or more sensors 50 and one or more of the gangs of the multi-gang wall plate 20 may not include such other features of the faceplate module described herein.

As noted above, the one or more control devices, e.g., the one or more sensors 50, may be provided to initiate activation and/or deactivation of the electrical wiring device 72 of the electrical wiring device module 70 and possibly other electrical wiring devices in the overall electrical circuit to which the device assembly 10 is connected. In another embodiment, the one or more control devices may be provided to activate and/or deactivate the electrical wiring device 72 of the electrical wiring device module 70 and possibly other electrical wiring devices in the overall electrical circuit to which the device assembly 10 is connected. Non-limiting examples of the one or more sensors 50 contemplated by the present disclosure include capacitive type sensors (seen in FIG. 5), time of flight sensors (seen in FIG. 6), pressure sensors, touch sensors, motion sensors and thermal sensors. Non-limiting examples of capacitive type sensors include sensors to detect and measure proximity, pressure, position and displacement, acceleration, force, humidity and fluid level. Non-limiting examples of time of flight sensors includes sensors capable of measuring the time taken by an object, particle or wave, e.g., an acoustic wave, a light wave or electromagnetic wave, to travel a distance through a medium, Non-limiting examples of pressure sensors include transducers that generate an electrical signal as a function of the pressure imposed on the transducer. Non-limiting examples of touch sensors include sensors that can detect touch or near proximity without relying on physical contact and are often able to respond differently to different kinds of touch, such as tapping, swiping and pinching. Non-limiting examples of motion sensors include devices that can detect and capture physical and/or kinetic movements in real time. Non-limiting examples of thermal sensors include devices capable of measuring temperature, temperature differences and temperature changes such as IR and PIR sensors.

Figure 7:
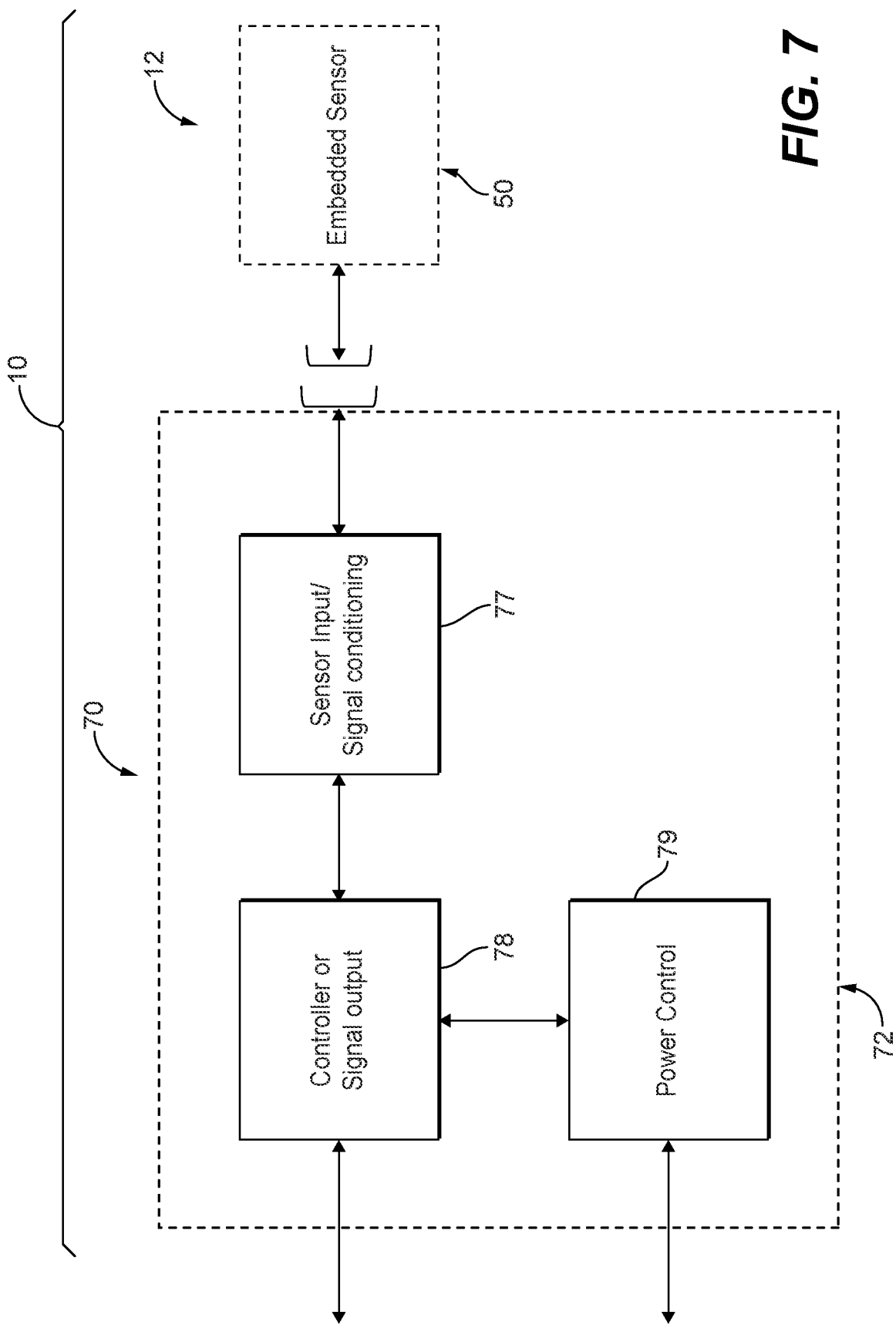
FIG. 7 is an exemplary circuit block diagram of the electrical wiring device module and faceplate module according to the present disclosure.

Continuing to refer to FIGS. 1-4, in this exemplary embodiment the device module 70 includes an electrical wiring device 72 and a mounting plate 74. In this exemplary embodiment, the electrical wiring device 72 is an electronic assembly. The electrical wiring device 72 and the mounting plate 74 may be integrally or monolithically formed as a single unit, or the electrical wiring device 72 and the mounting plate 74 may be separate components joined together with, for example, adhesives or mechanical fasteners. In the exemplary embodiment of FIG. 7, the electrical wiring device 72 is an electronic assembly. The electronic assembly 72 may include sensor input and signal conditioning circuitry 77 that receives information for one or more sensors 50 and conditions the received information for processing by the controller or signal output circuitry 78. The sensor input and signal conditioning circuitry 77 acts as an interface between the one or more sensors 50 and the electrical wiring device 72 circuitry providing power and analog and digital signals for control and/or operation. The controller or signal output circuitry 78 may output a control signal that drives a power control 80 or may output a 1-24 volt DC or AC electronic control signal that drives various types of electronic devices, such as a 1-24 volt DC or AC electronic lighting control signal. An example of a power control 78 is a HF115F-L 1 pole miniature high power latching relay manufactured by Xiamen Hongfa. Electronics Co.

Figure 8:
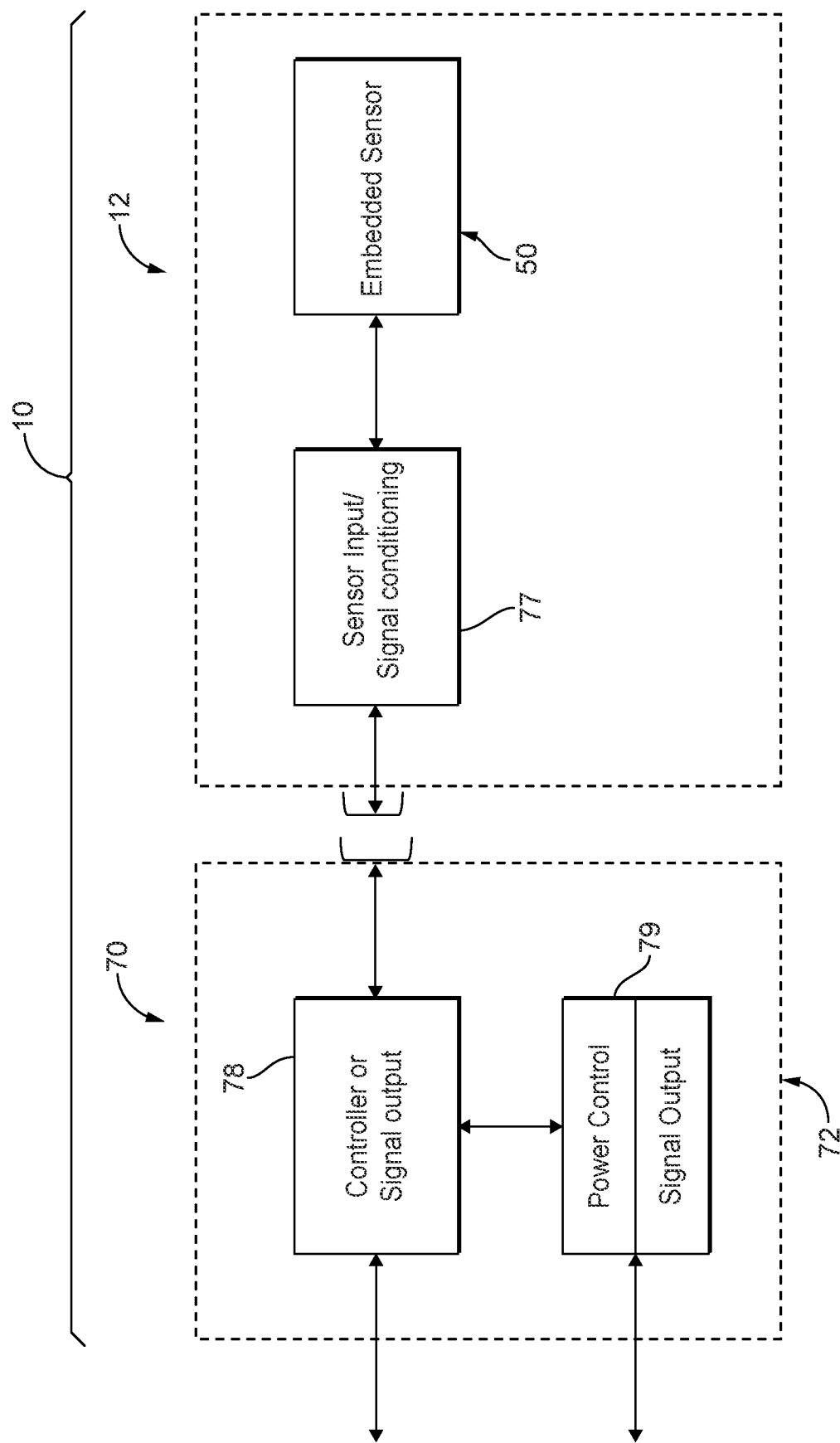
FIG. 8 is another exemplary circuit block diagram of the electrical wiring device module and faceplate module according to the present disclosure.
Figure 9:
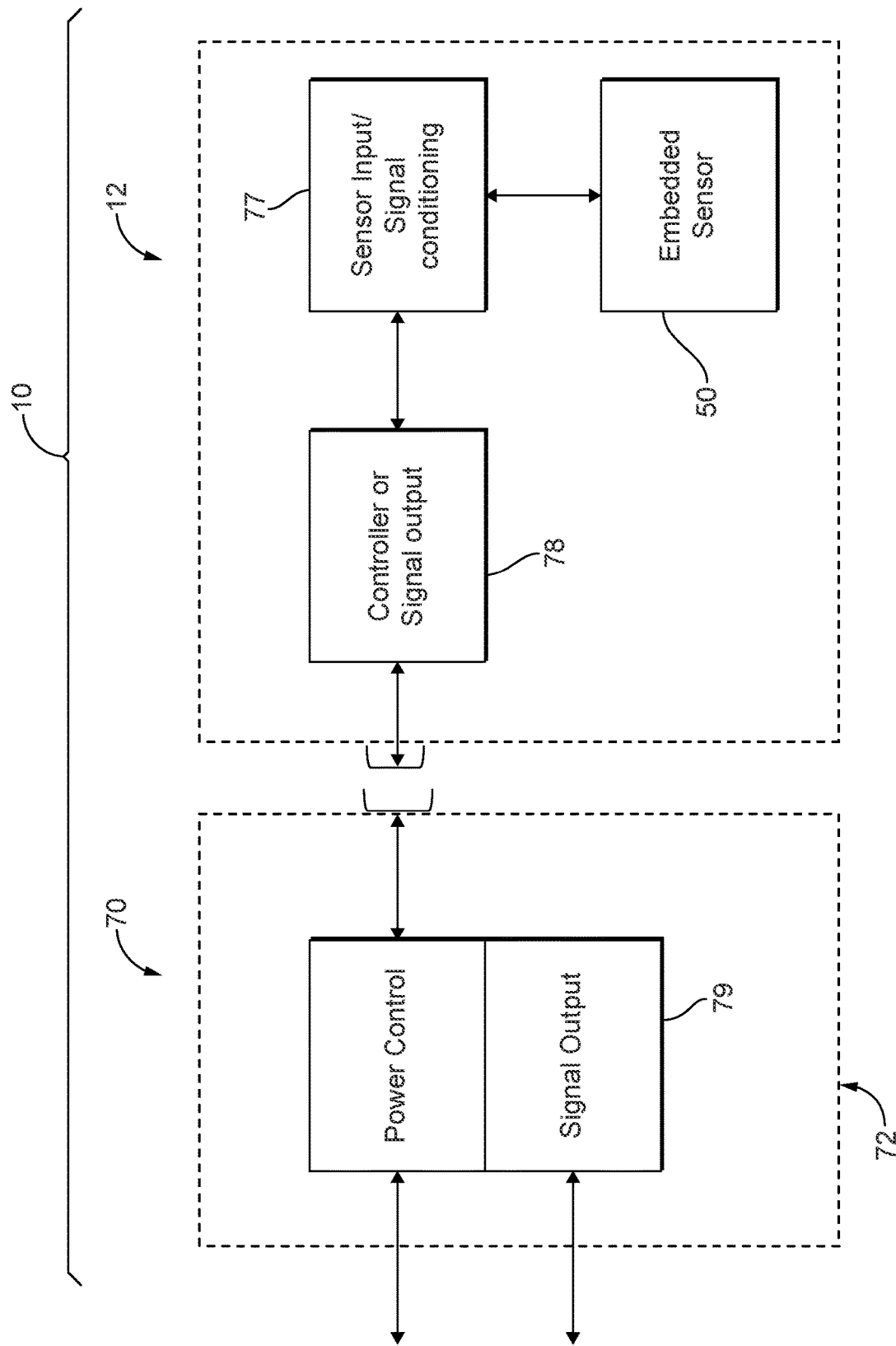
FIG. 9 is another exemplary circuit block diagram of the electrical wiring device module and faceplate module according to the present disclosure.

In the exemplary embodiment of FIG. 8, the faceplate module 12 includes the one or more sensors 50 and the sensor input and signal conditioning circuitry 77 that receives information for the one or more sensors 50 and conditions the received information for processing by the controller or signal output circuitry 78 as described above. In this embodiment, the wiring device module 70 includes the controller or signal output circuitry 78 that may output a control signal that drives a power control 80 or may output a 1-24 volt DC: or AC electronic control signal that drives various types of electronic devices, such as a 0-24 volt or other low voltage electronic control signal. In the exemplary embodiment of FIG. 9, the faceplate module 12 includes the one or more sensors 50, the sensor input and signal conditioning circuitry 77, and the controller or signal output circuitry 78. The sensor input and signal conditioning circuitry 77 receives information for the one or more sensors 50 and conditions the received information for processing by the controller or signal output circuitry 78 as described above. The controller or signal output circuitry 78 may output a control signal that drives a power control 80 or may output a 1-24 volt DC or AC electronic control signal that drives various types of electronic devices, such as a 1-24 electronic lighting control signal.

Referring again to refer to FIGS. 1-4, in this exemplary embodiment, the electronic assembly 72 is a solid state switch used to control one or more electrical loads, such as turning one or more electrical loads "on" or "off" in response to the one or more sensors 50. To turn the electrical load "on" the exterior surface 20*b* of the wall plate 20 may be touched causing the electronic assembly 72 to energize one or more electrical relays built into the electronic assembly 72. To turn the electrical load "off" the exterior surface 20*c* of the wall plate 20 may be again touched to de-energize the one or more electrical relays built into the electronic assembly 72.

Figure 10:
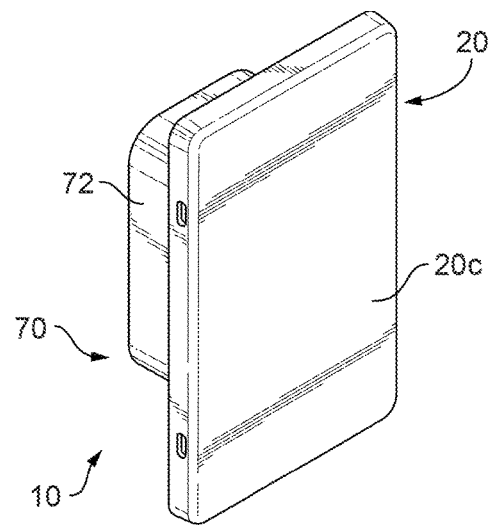
FIG. 10 is a front perspective view of another exemplary embodiment of a wiring device assembly according to the present disclosure.
Figure 11:
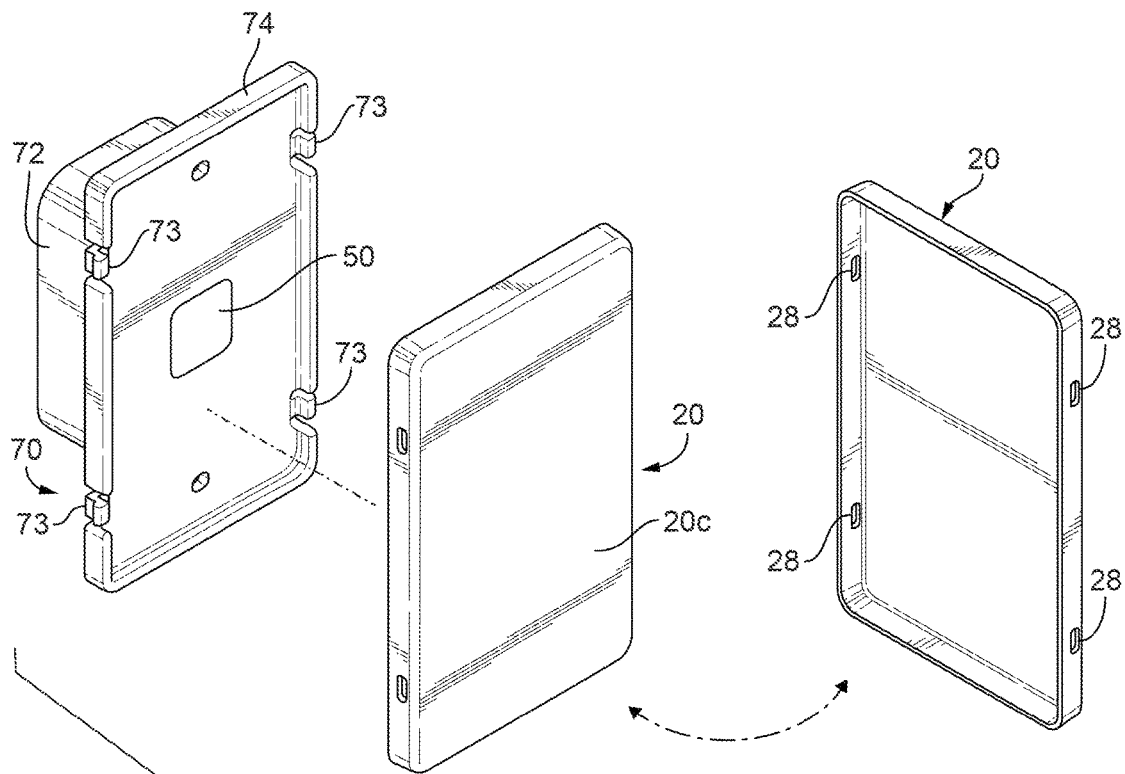
FIG. 11 is a partially exploded perspective view of the wiring device assembly of FIG. 10, illustrating an electrical wiring device module with an embedded sensor in a mounting plate of the electrical wiring device module and a faceplate module.
Figure 12:
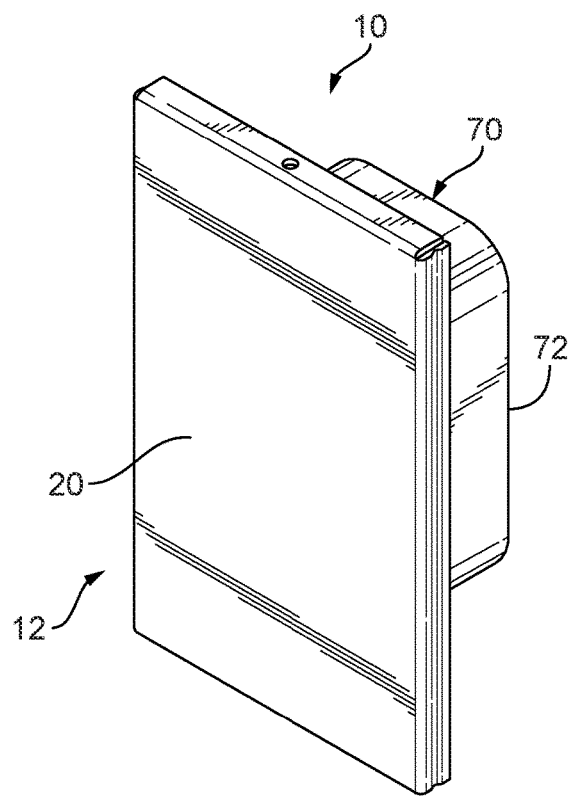
FIG. 12 is a front perspective view of another exemplary embodiment of a wiring device assembly according to the present disclosure.
Figure 13:
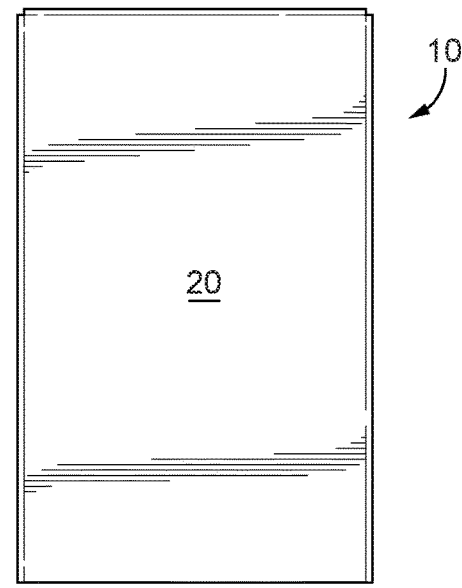
FIG. 13 is a front elevation view of the wiring device assembly of FIG. 12.
Figure 14:
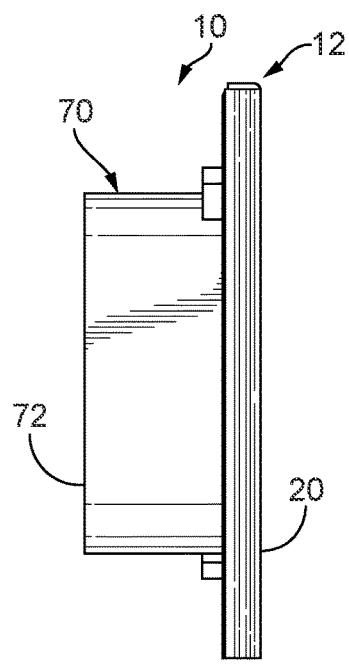
FIG. 14 is a side elevation view of the wiring device assembly of FIG. 12.
Figure 15:
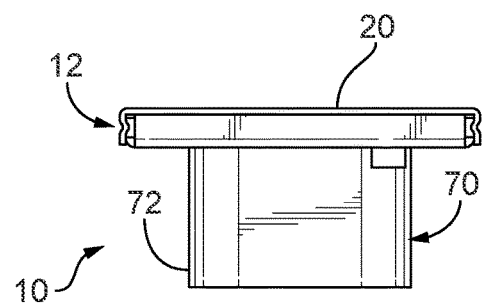
FIG. 15 is a bottom elevation view of the wiring device assembly of FIG. 12.
Figure 18:
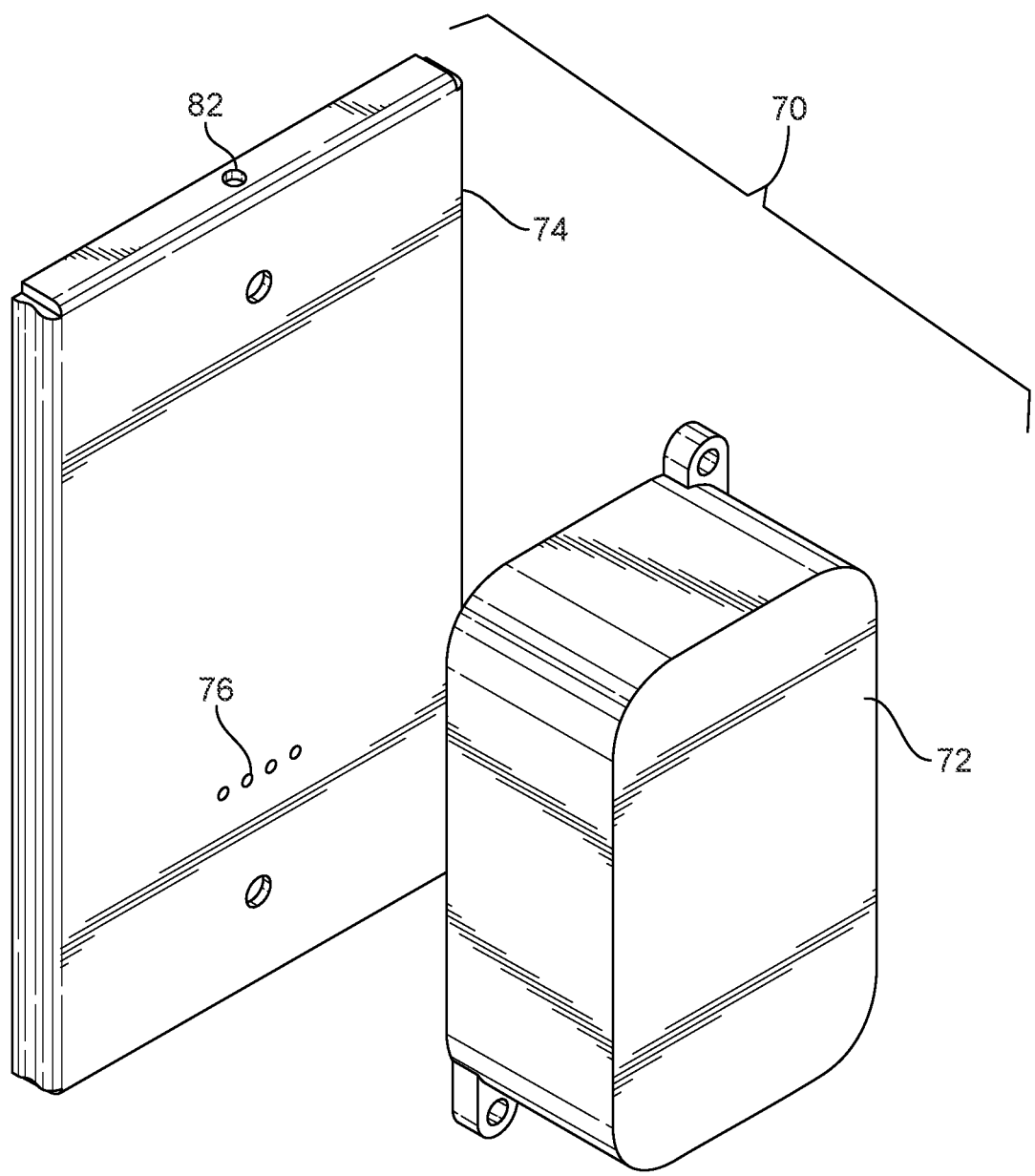
FIG. 18 is a rear perspective view of the electrical wiring device module of FIG. 12, illustrating an electronic assembly separated from a mounting plate.
Figure 19:
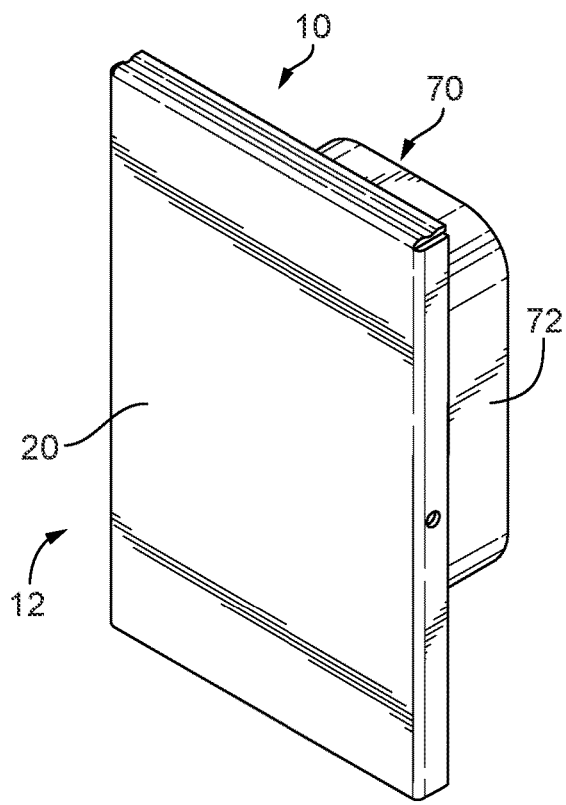
FIG. 19 is a front perspective view of another exemplary embodiment of a wiring device assembly according to the present disclosure.
Figure 20:
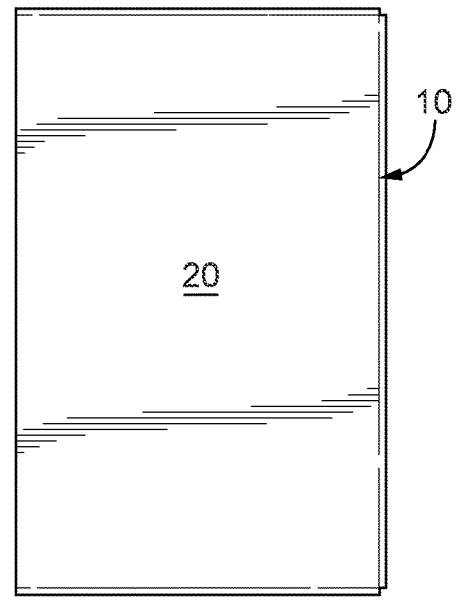
FIG. 20 is a front elevation view of the wiring device assembly of FIG. 19.
Figure 21:
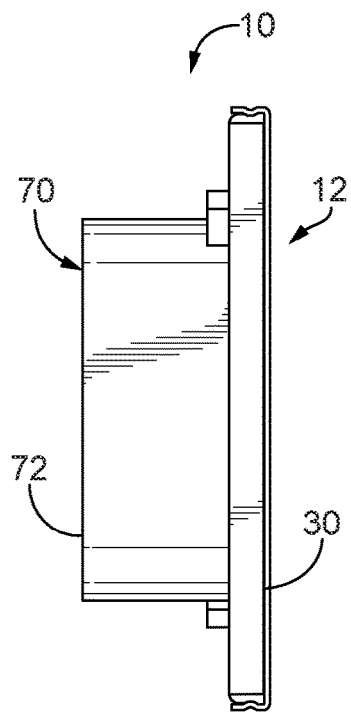
FIG. 21 is a side elevation view of the wiring device assembly of FIG. 19.
Figure 22:
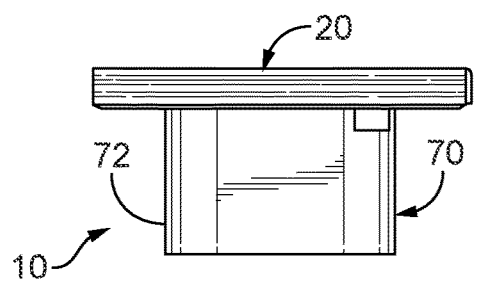
FIG. 22 is a bottom elevation view of the wiring device assembly of FIG. 19.

In another exemplary embodiment, the wiring device module 70 may include the one or more electronic sensors 50 that may be embedded within the mounting plate 74 and/or the electronic assembly 72. In another embodiment, the one or more electronic sensors 50 may be attached to the mounting plate 74 and/or the electronic assembly 72 of the wiring device module 70. As shown in FIGS. 10 and 11, the one or more electronic sensors 50 may be embedded within or attached to the mounting plate 74. In this exemplary embodiment, the electrical connections between the one or more electronic sensors 50 and the electrical wiring device 72 may be made using electrical contacts on the rear surface of the mounting plate 74 and the outer surface of the electrical wiring device 72, similar to the electrical connections described herein using the electrical contacts 34 and 76. Further, in this exemplary embodiment, the faceplate module 12 would include the wall plate 20 mounted to the wiring device module 70 by a snap fit connection. More specifically, in this exemplary embodiment, the faceplate module 12 includes the wall plate 20 that can be mounted to the mounting plate 74 by a snap fit where flexible arms 73 of the wiring device module 70 fit into openings 28 in the wall plate 20 to releasably interlock the wall plate and the mounting plate.

Figure 4:
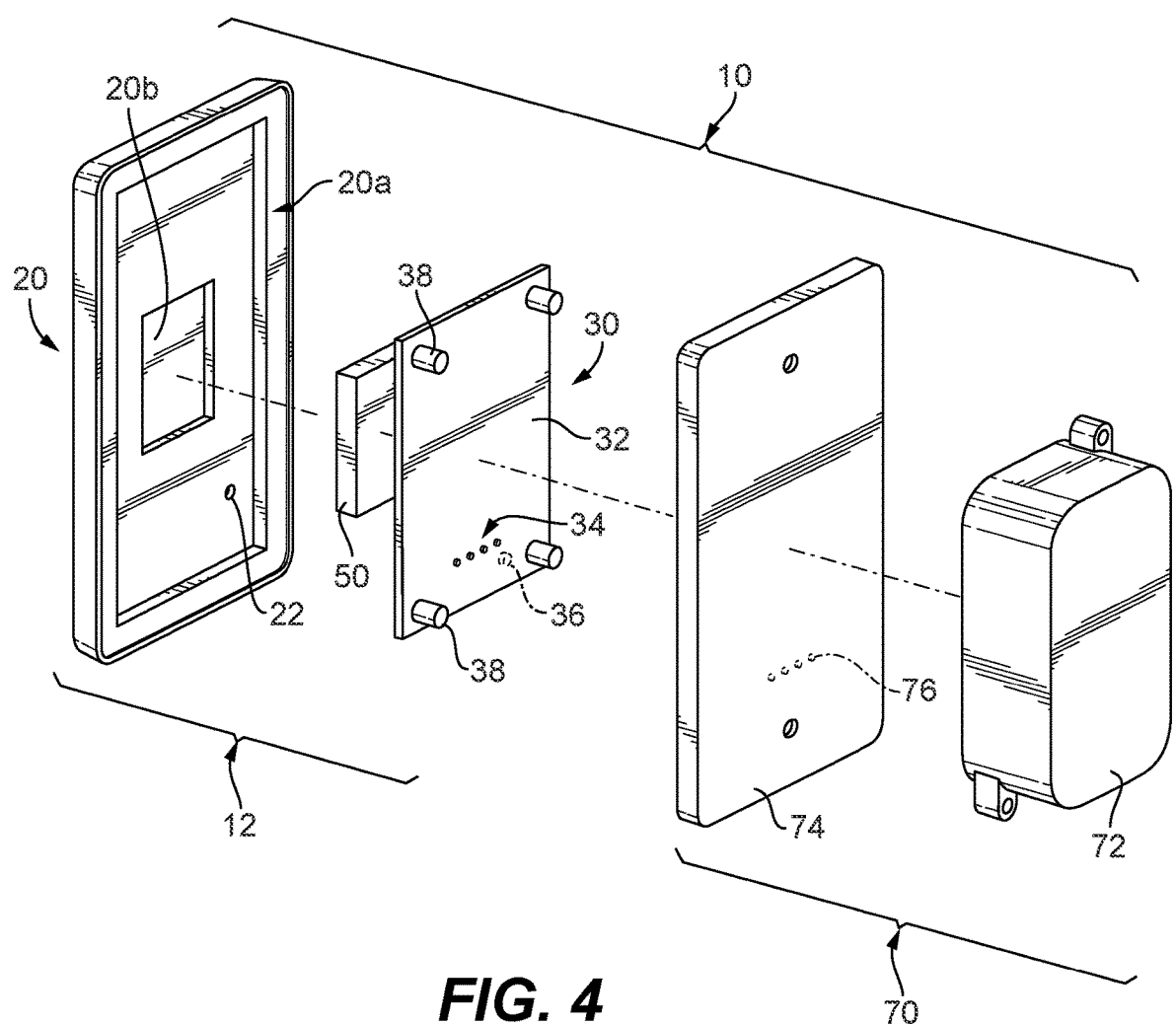
FIG. 4 is an exploded rear perspective view of the wiring device assembly of FIG. 2, illustrating the faceplate module and the electrical wiring device module.

Referring again to FIGS. 1, 2 and 4, one exemplary embodiments of the faceplate module 12 includes the wall plate 20, the one or more sensors 50 and the wiring device interface 30. In the exemplary embodiment shown, the sensor 50 and at least a portion of the wiring device interface 30 are embedded in the cavity 20*a* of the wall plate 20, as shown in FIG. 4. In this exemplary embodiment, the wiring device interface 30 includes a printed circuit board 32, one or more electrical contacts 34 and an indicator 36, such as a LED. The one or more electrical contacts 34 are configured to align with and contact corresponding one or more electrical contacts 76 on the mounting plate 24 of the wiring device module 70 as shown. The one or more electrical contacts 76 and the one or more electrical contacts 34 may be used for power connections and/or data connections that permit the transfer of information between the wiring device module 70 and the one or more sensors 50. In the event the wall plate 20 includes a display, the one or more electrical contacts 76 and the one or more electrical contacts 34 may be used for power connections and/or data connections that permit the transfer of information between the wiring device module 70 and the display. The indicator 36 is preferably aligned with the aperture 22 in the wall plate 20, as seen in FIG. 1, so that light emitted by the indicator, here the LED, is visible from the wall plate 20. The wiring device interface 30 may also include one or more standoffs 38 that may be used to attach and/or adhere the faceplate module 12 to the wiring device module 70.

Figure 5:
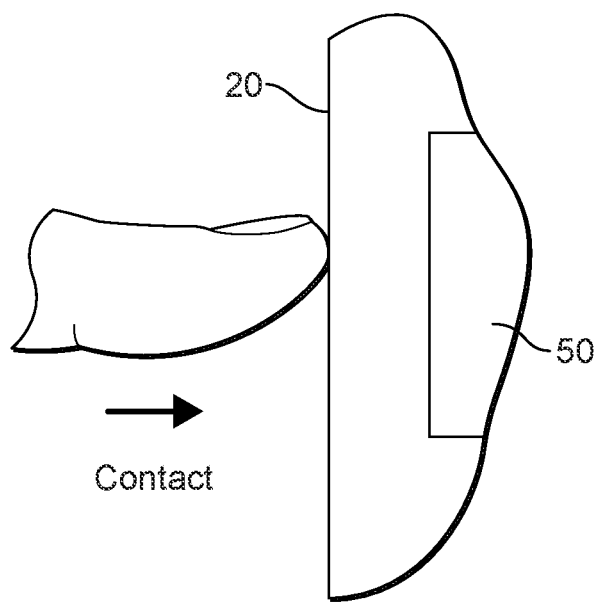
FIG. 5 is an enlarged side elevation view of a portion of the faceplate module of FIG. 1 taken from detail 8,9 with the embedded sensor being a touch sensitive type sensor.
Figure 6:
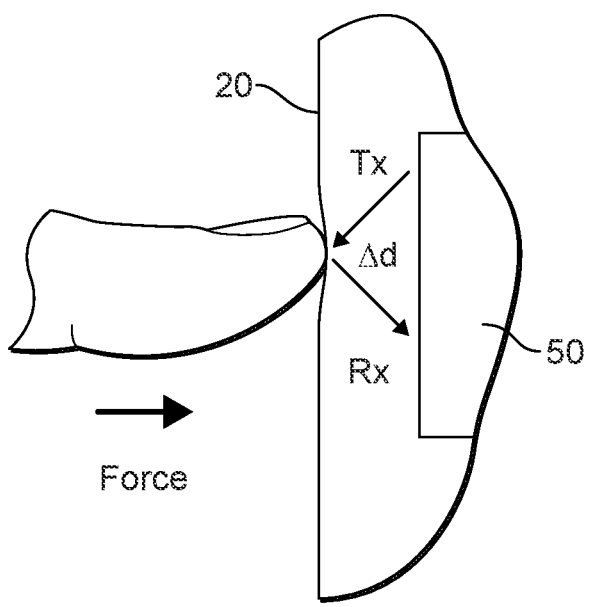
FIG. 6 is an enlarged side elevation view of a portion of the faceplate module of FIG. 1 taken from detail 8,9 with the embedded sensor being a time of flight type sensor.

Referring to FIGS. 5 and 6, exemplary embodiments of the faceplate module 12, similar to the faceplate module of FIG. 7A, are shown. However, in the embodiment of FIG. 5, the faceplate assembly includes an accelerometer sensor 50. In the embodiment of FIG. 6, the faceplate assembly 12 includes a time of flight sensor 50.

Referring to FIGS. 12-18, another exemplary embodiment of the wiring device assembly according to the present disclosure is shown. This exemplary embodiment shows the wall plate 20 of the faceplate module 12 being mounted to the mounting plate 74 of the wiring device module 70 by sliding the wall plate 20 vertically onto the mounting plate 74 from the top of the mounting plate 74 to the bottom of the mounting plate. To vertically interlock the wall plate 20 to the mounting plate 74, the wall plate 20 may include a pair of side walls 20*d* and the mounting plate 74 may include a pair of side walls 74*a*. Each wall plate side wall 20*d* may include a curved surface, e.g., a bulge, with the apex extending toward a center of the wall plate 20. For ease of description, the curved surface of the side wall 20*d* of the wall plate 20 may also be referred to herein as the "side bulge." The side bulge may extend along a predefined length of the respective side wall 20*d* or the side bulge may extend along the full length of the respective side wall 20*d*. Each mounting plate side wall 74*a* may include a curved surface, e.g., a depression, that is configured to receive the side bulge on the side wall 20*d* of the wall plate 20. For ease of description, the curved surface of the side wall 74*a* of the mounting plate 74 may also be referred to herein as the "side depression." In this configuration, when the wall plate 20 is mounted to the mounting plate 74, the side bulges are within the side depressions so that the two plates are interlocked holding the wall plate 20 in position on the mounting plate 74, as shown in FIGS. 16 and 17. Of course, the wall plate 20 of the faceplate module 12 can be mounted to the mounting plate 74 of the wiring device module 70 by sliding the wall plate 20 vertically onto the mounting plate 74 from the bottom of the mounting plate 74 to the top of the mounting plate. After the wall plate 20 is mounted to the mounting plate 74, a fastener 77, seen in FIG. 33, can be passed through aperture 26 in an end wall 20*e* of the wall plate 20 and threaded into aperture 82 in an end wall 74*b* of the mounting plate 74, seen in FIG. 16.

Figure 23:
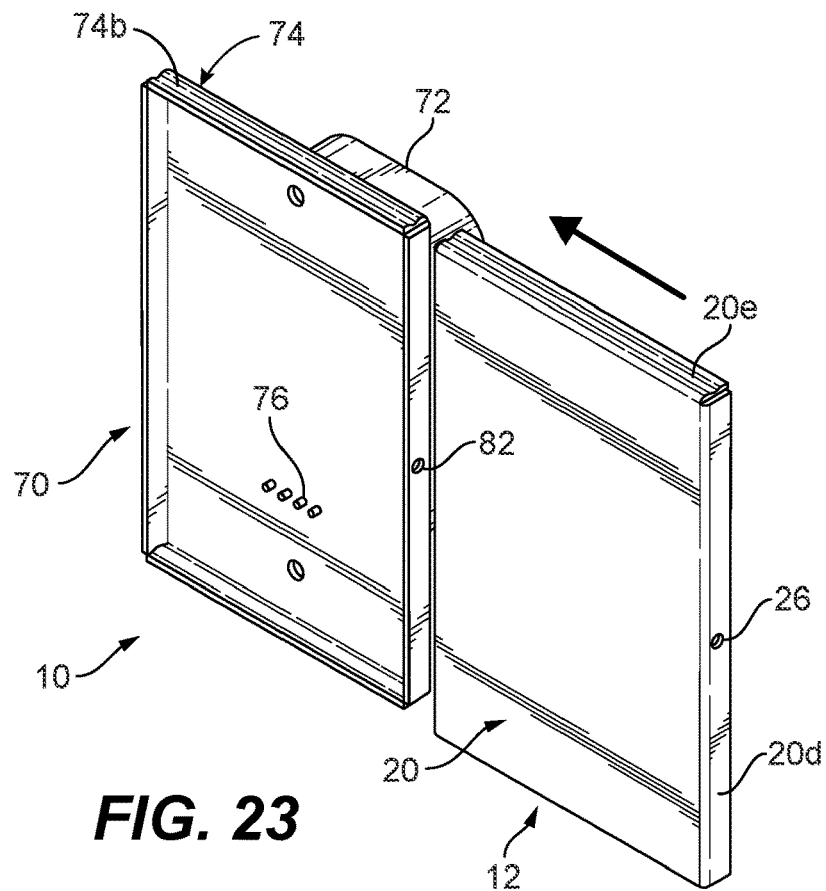
FIG. 23 is a front perspective view of the wiring device assembly of FIG. 19, illustrating faceplate module separated from the electrical wiring device module and positioned for horizontal mounting to a mounting plate of the electrical wiring device module.
Figure 24:
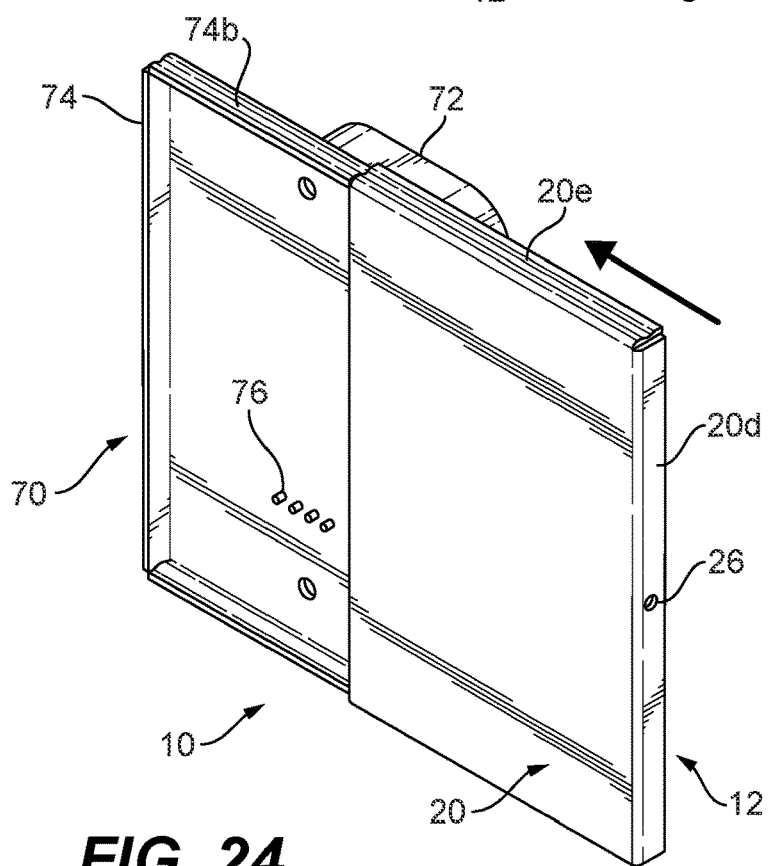
FIG. 24 is a front perspective view of the wiring device assembly of FIG. 23, illustrating a wall plate of the faceplate module being mounted to the mounting plate of the electrical wiring device module.
Figure 25:
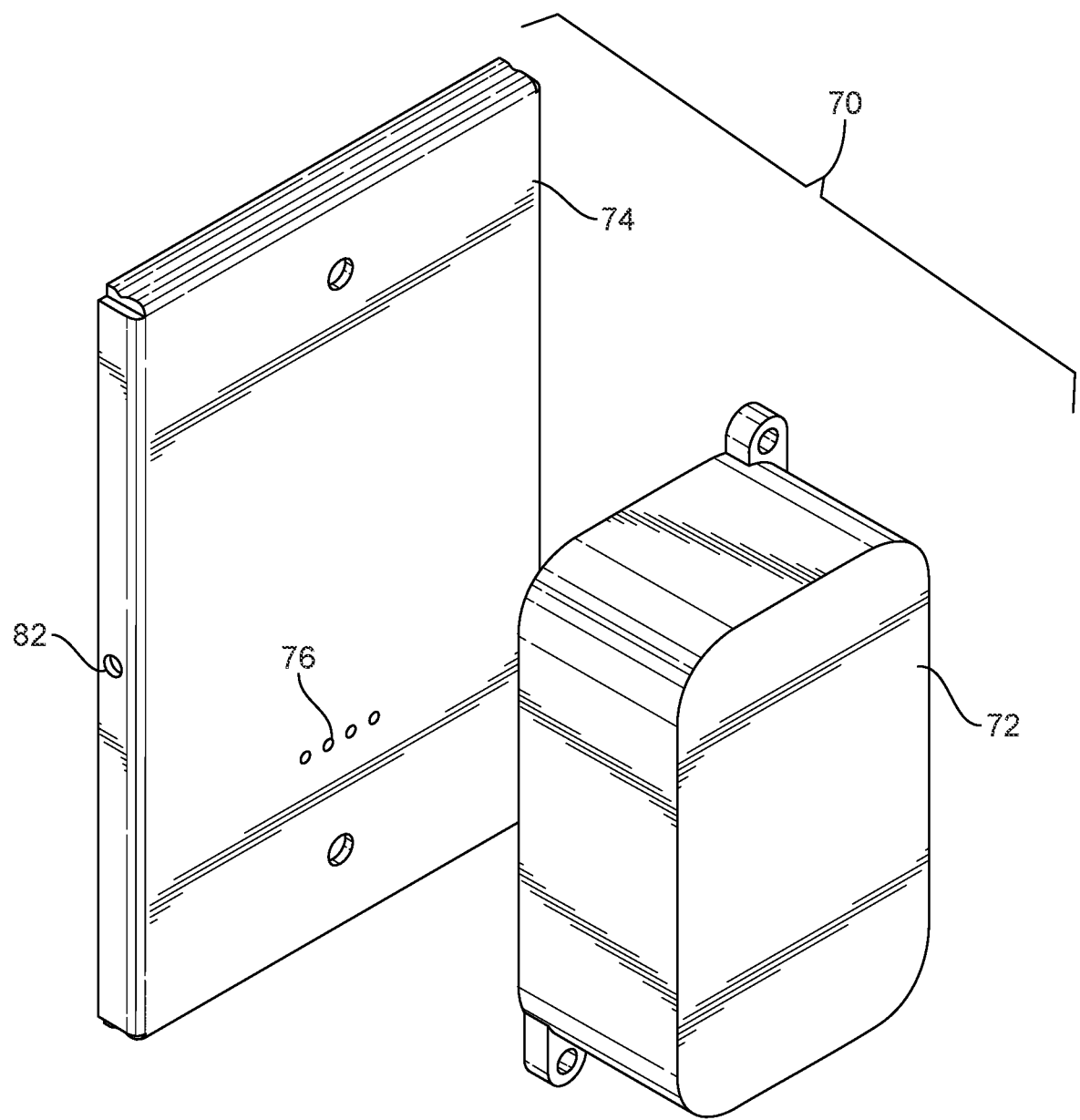
FIG. 25 is a rear perspective view of the electrical wiring device module of FIG. 23, illustrating an electronic assembly separated from the mounting plate.
Figure 26:
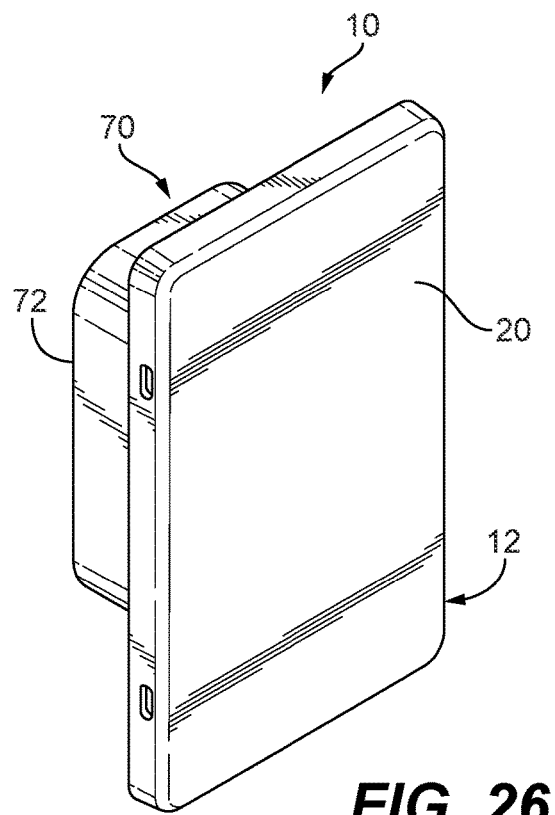
FIG. 26 is a front perspective view of another exemplary embodiment of a wiring device assembly according to the present disclosure.
Figure 27:
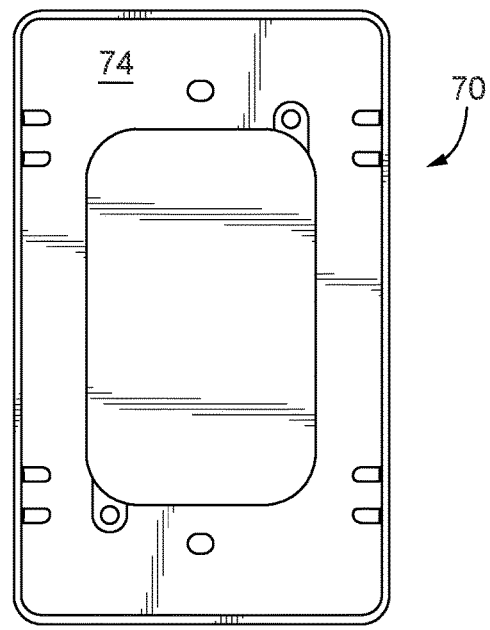
FIG. 27 is a rear elevation view of the wiring device assembly of FIG. 26.
Figure 28:
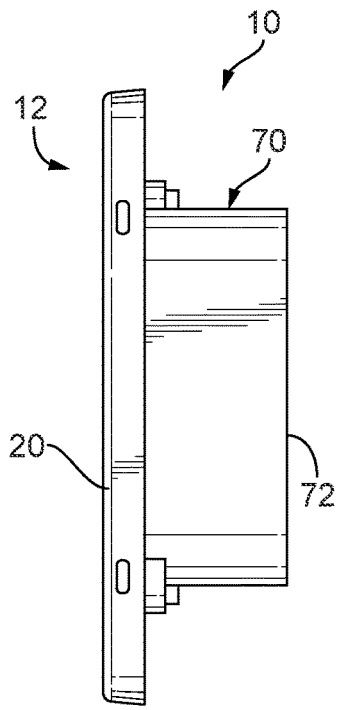
FIG. 28 is a side elevation view of the wiring device assembly of FIG. 26.
Figure 29:
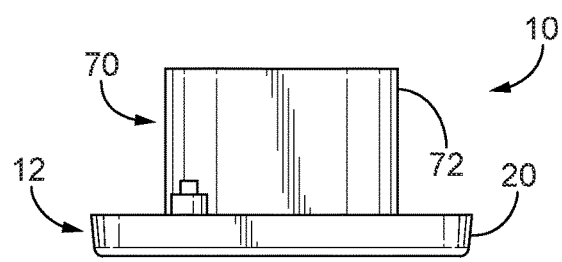
FIG. 29 is a bottom elevation view of the wiring device assembly of FIG. 26.
Figure 30:
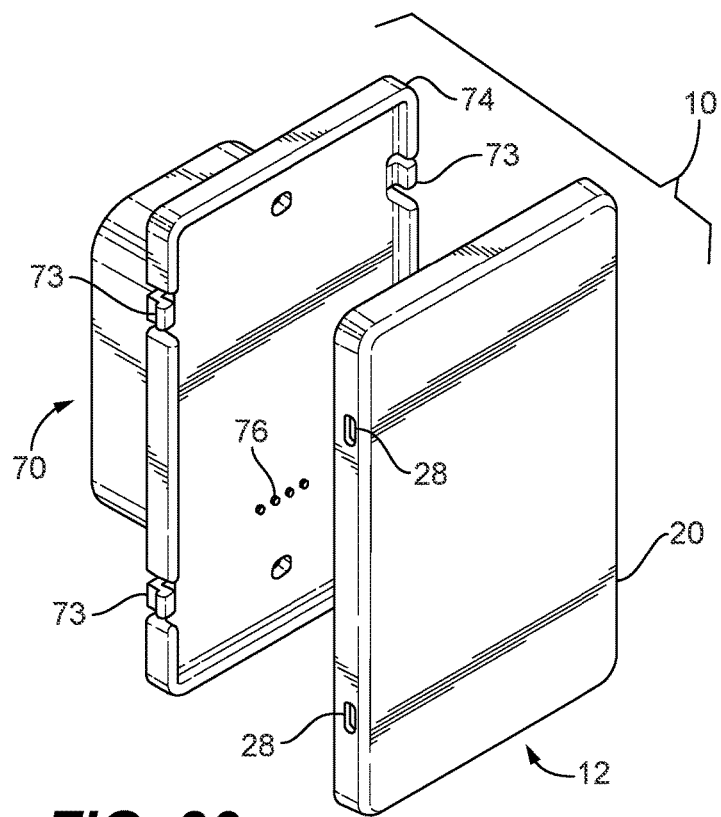
FIG. 30 is a front perspective view of the wiring device assembly of FIG. 26, illustrating the faceplate module separated from the electrical wiring device module and positioned for mounting to a mounting plate of the electrical wiring device module.
Figure 31:
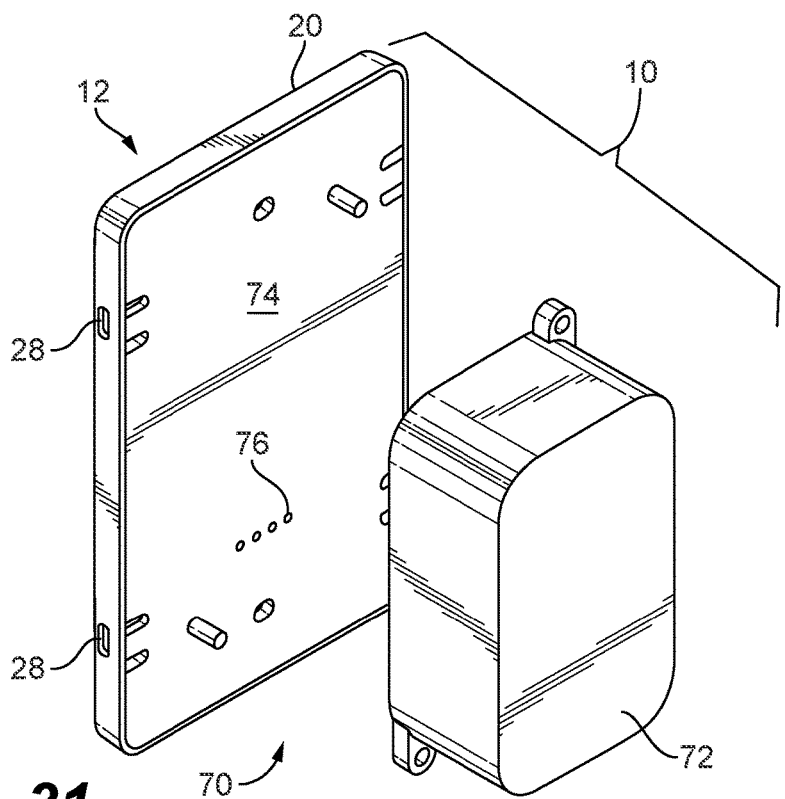
FIG. 31 is a rear perspective view of the electrical wiring device module of FIG. 26, illustrating an electronic assembly of the electrical wiring device module separated from the mounting plate.

Referring to FIGS. 19-25, another exemplary embodiment of the wiring device assembly according to the present disclosure is shown. This exemplary embodiment shows the wall plate 20 of the faceplate module 12 being mounted to the mounting plate 74 of the wiring device module 70 by sliding the wall plate 20 onto the mounting plate 74 horizontally from one side of the mounting plate 74 to the other side of the mounting plate. To horizontally interlock the wall plate 20 to the mounting plate 74, the wall plate 20 may include a pair of end walls 20*e* and the mounting plate 74 may include a pair of end walls 74*b*. Each wall plate end wall 20*e* may include a curved surface, e.g., a bulge, with the apex extending toward a center of the wall plate 20. For ease of description, the curved surface of the end wall 20*e* of the wall plate 20 may also be referred to herein as the "end bulge." The end bulge may extend along a predefined length of the respective end wall 20*e* or the end bulge may extend along the full length of the respective end wall 20*e*. Further, each mounting plate end wall 74*b* may include a curved surface, e.g., a depression, that is configured to receive the end bulge on the side wall 20*d* of the wall plate 20. For ease of description, the curved surface of the end wall 74*b* of the mounting plate 74 may also be referred to herein as the "end depression." In this configuration, when the wall plate 20 is mounted to the mounting plate 74, the end bulges are within the end depressions so that the two plates are interlocked holding the wall plate 20 in position on the mounting plate 74, as shown in FIGS. 23 and 24. After the wall plate 20 is mounted to the mounting plate 74, a fastener 77, seen in FIG. 33, can be passed through aperture 26 in the side wall 20*d* of the wall plate 20 and threaded into aperture 82 in the side wall 74*a* of the mounting plate 74, seen in FIG. 23.

Referring now to FIGS. 26-31, another exemplary embodiment of the device assembly 10 according to the present disclosure is shown. This exemplary embodiment shows the faceplate module 12 being mounted to the wiring device module 70 by a snap fit connection. More specifically, in this exemplary embodiment, the faceplate module 12 includes the wall plate 20 that can be mounted to the mounting plate 74 by a snap fit where flexible arms 73 of the wiring device module 70 fit into openings 28 in the wall plate 20 to releasably interlock the wall plate and the mounting plate.

Figure 32:
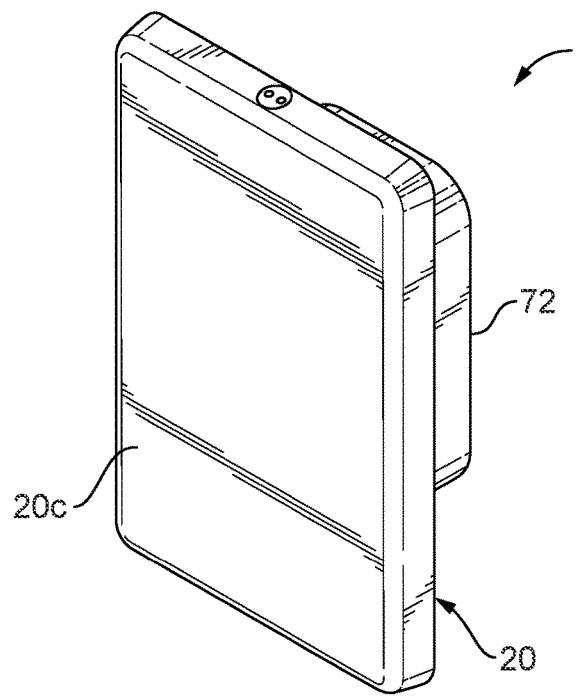
FIG. 32 is a front perspective view of another exemplary embodiment of a wiring device assembly according to the present disclosure.
Figure 33:
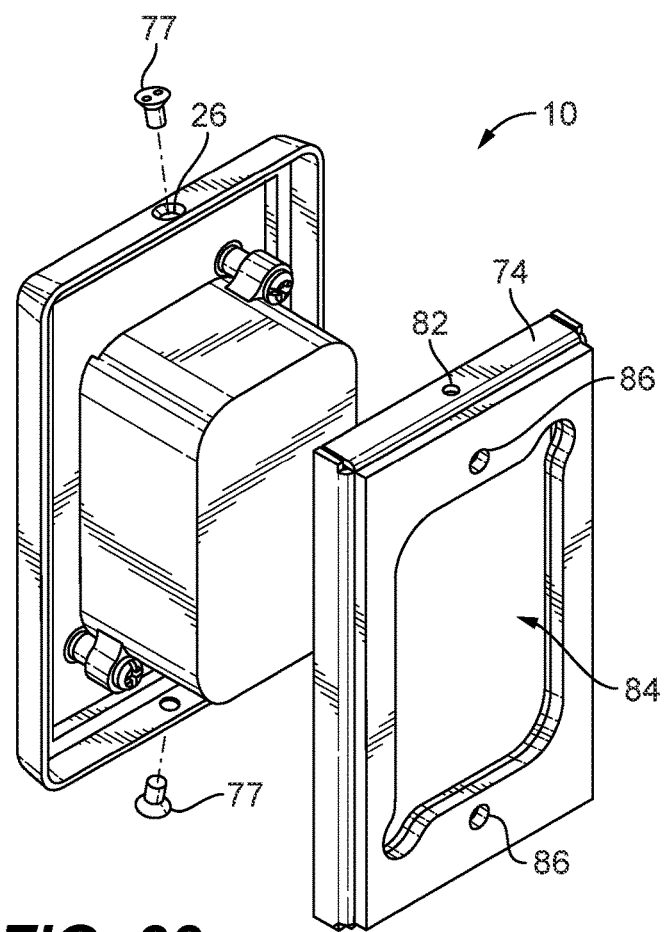
FIG. 33 is a partially exploded perspective view of the wiring device assembly of FIG. 32, illustrating an electrical wiring device of an electrical wiring device module mounted to a faceplate module.
Figure 34:
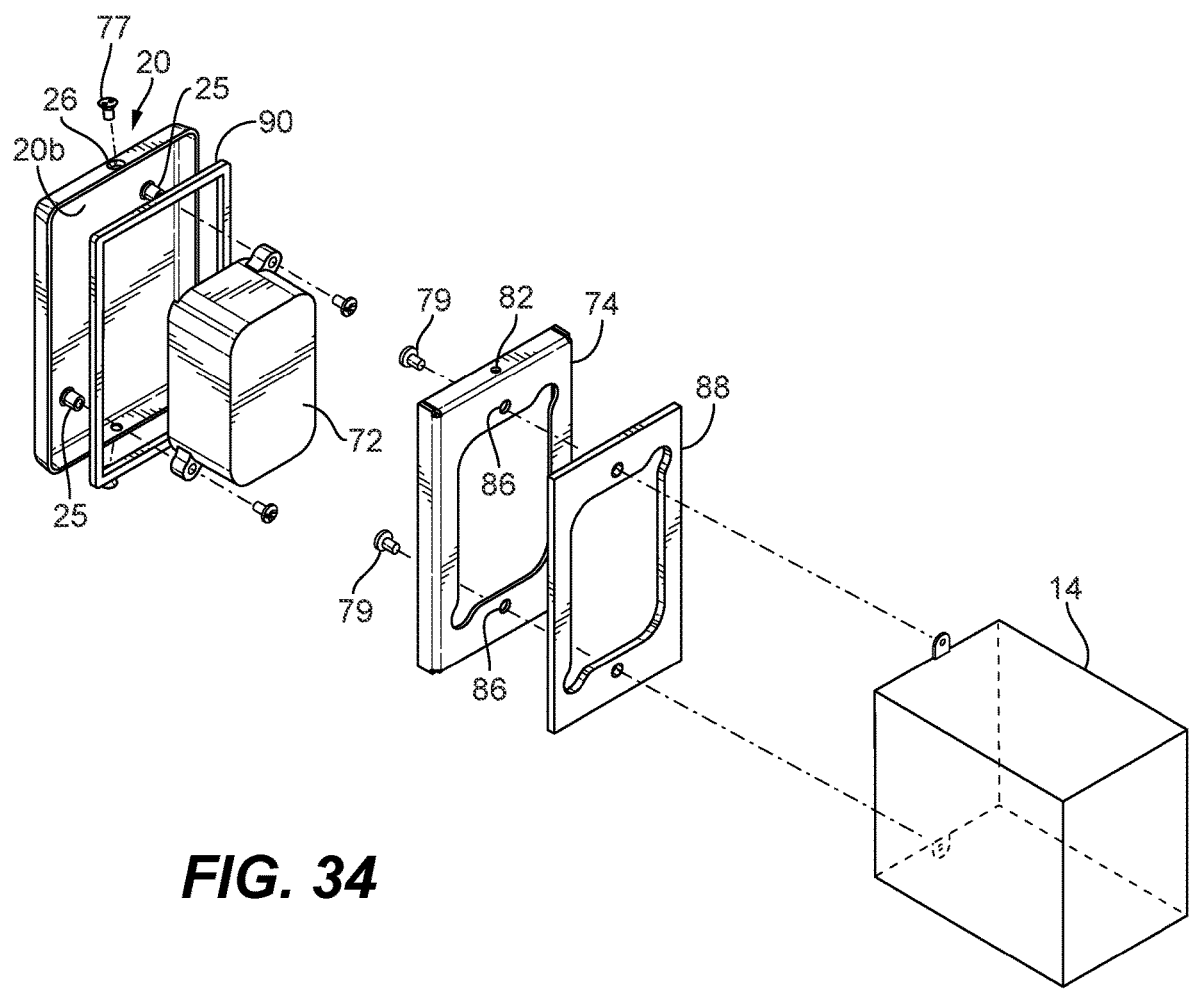
FIG. 34 is a rear exploded perspective view of the wiring device assembly of FIG. 32, illustrating a mounting plate of the electrical wiring device module mounted to an electrical box, the electrical wiring device mounted of the electrical wiring device module mounted to the faceplate module and a wall plate of the faceplate assembly mounted to the mounting plate.

Referring now to FIGS. 32-34, another exemplary embodiment of the device assembly 10 according to the present disclosure is shown. In this exemplary embodiment, the mounting plate 74 of the wiring device module 70 includes an opening 84 through which electrical wiring device 72, here the electronic assembly, can pass and mounting holes 86 used when attaching the mounting plate 74 to the electrical box 14, seen in FIG. 34, using for example fasteners 79. A gasket 88 may be positioned between the mounting plate 74 and the electrical box 14 to limit and possible prevent moisture from entering the electrical box 14. In this exemplary embodiment, the electrical wiring device 72, here the electronic assembly, can be mounted to standoffs 25 extending from the inside surface 20*b* of the wall plate 20 and responsive to touch, pressure, force, etc. on the exterior surface 20*c* of the wall plate 20. However, the electrical wiring device 72 can be mounted to the wiring device interface 30. A gasket 90 may be positioned between the wall plate 20 and the mounting plate 74 to also limit and possible prevent moisture from entering the electrical box 14 and from contacting the electrical wiring device 72.

Figure 35:
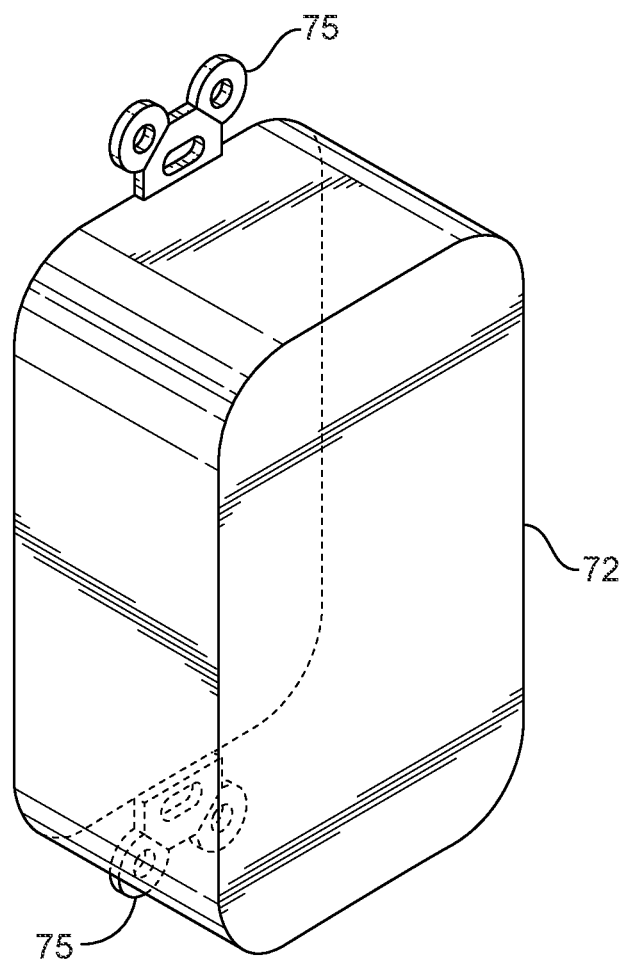
FIG. 35 is a perspective view of another exemplary embodiment of an electronic assembly of the electrical wiring device module of the present disclosure, illustrating a yoke for mounting the electronic assembly to an electric box and for mounting the faceplate assembly to the electrical box.

Referring to FIG. 35, another exemplary embodiment of an electronic assembly 72 of the wiring device module 70 is shown. In this exemplary embodiment, a yoke 75 is attached to the electrical wiring device 72, here the electronic assembly, and used for mounting the electrical wiring device to an electric box and for mounting the faceplate module 12 to the wiring device module 70.

It is noted that the wiring device module 70 and/or the faceplate module 12 may be configured to communicate with other devices using, for example, known WiFi, Bluetooth, Zigbee, or other lower energy communication or known near field communication (NFC) technology.

As used in this application, the terms "front," "rear," "upper," "lower," "upwardly," "downwardly," and other orientational descriptors are intended to facilitate the description of the exemplary embodiments of the present invention, and are not intended to limit the structure of the exemplary embodiments of the present invention to any particular position or orientation. While illustrative embodiments of the present disclosure have been described and illustrated above, it should be understood that these are exemplary of the disclosure and are not to be considered as limiting. Additions, deletions, substitutions, and other modifications can be made without departing from the spirit or scope of the present disclosure. Accordingly, the present disclosure is not to be considered as limited by the foregoing description.

What is claimed is:

1. A wiring device assembly comprising:
a wiring device module having an electrical wiring device, a mounting plate configured to be mounted to an electrical box and at least one sensor, the mounting plate being a singular structure, the electrical wiring device being attached to a first surface of the mounting plate, and the at least one sensor being attached to a second surface of the mounting plate and in electrical communication with the electrical wiring device; and
a wall plate that is releasably attachable to the mounting plate.

2. The wiring device assembly according to claim 1, wherein the mounting plate includes at least one flexible arm that fits into at least one opening in the wall plate to releasably attach the wall plate and the mounting plate.

3. The wiring device assembly according to claim 1, wherein the wall plate has a substantially smooth outer surface.

4. The wiring device assembly according to claim 1, wherein the at least one sensor comprises a capacitive type sensor or a time of flight sensor.

5. The wiring device assembly according to claim 1, wherein the wiring device comprises a solid state switch used to control one or more electrical loads.

6. The wiring device assembly according to claim 1, wherein the wall plate is releasably attachable to the mounting plate using one or more snap-fit connections.

7. The wiring device assembly according to claim 6, wherein each of the one or more snap-fit connections comprises a flexible arm extending from the mounting plate that fit into an opening in the wall plate.

8. A wiring device assembly comprising:
a wiring device module having an electrical wiring device, a mounting plate configured to be mounted to an electrical box and at least one sensor, the mounting plate being a singular structure, the electrical wiring device being attached to a first surface of the mounting plate, and the at least one sensor being: attached to a second surface of the mounting plate and in electrical communication with the electrical wiring device; and
a wall plate that is releasably attachable to the mounting plate using one or more snap-fit connections.

9. The wiring device assembly according to claim 8, wherein the wiring device comprises a solid state switch used to control one or more electrical loads.

10. The wiring device assembly according to claim 8, wherein the wall plate has a substantially smooth outer surface.

11. The wiring device assembly according to claim 8, wherein the at least one sensor comprises a capacitive type sensor or a time of flight sensor.

12. The wiring device assembly according to claim 8, wherein the at least one sensor comprises one of a pressure sensors, a touch sensor, a motion sensors and a thermal sensor.

13. The wiring device assembly according to claim 8, wherein each of the one or more snap-fit connections comprises a flexible arm extending from the mounting plate that fit into an opening in the wall plate.

14. The wiring device assembly according to claim 8, wherein each of the one or more snap-fit connections comprises a flexible arm extending from the wall plate that fit into an opening in the mounting plate.

15. A wiring device assembly comprising
a wiring device module having an electrical wiring device, a mounting plate configured to be mounted to an electrical box and at least one sensor, the mounting plate being a singular structure, the electrical wiring device being attached to a first surface of the mounting plate, and the at least one sensor being attached to a second surface of the mounting plate and in electrical communication with the electrical wiring device; and
a wall plate that is releasably attachable to the mounting plate using one or more snap-fit connections, each snap fit connection including a flexible arm extending from the mounting plate or the wall plate and an opening in the wall plate or the mounting plate.

16. The wiring device assembly according to claim 15, wherein the wiring device comprises a solid state switch used to control one or more electrical loads.

17. The wiring device assembly according to claim 15, wherein the wall plate has a substantially smooth outer surface.

18. The wiring device assembly according to claim 15, wherein the at least one sensor comprises a capacitive type sensor or a time of flight sensor.

19. The wiring device assembly according to claim 15, wherein the at least one sensor comprises one of a pressure sensors, a touch sensor, a motion sensors and a thermal sensor.

* * * * *